(12) United States Patent
Moore et al.

(10) Patent No.: US 7,764,366 B2
(45) Date of Patent: Jul. 27, 2010

(54) ROBOTIC DIE SORTER WITH OPTICAL INSPECTION SYSTEM

(75) Inventors: John D. Moore, Deerfield, NH (US); Lawrence F. Roberts, Londonderry, NH (US); Miroslaw Sokol, Bedford, NH (US)

(73) Assignee: BESI North America, Inc., Londonderry, NH (US)

( * ) Notice: Subject to any disclaimer, the term of this patent is extended or adjusted under 35 U.S.C. 154(b) by 1050 days.

(21) Appl. No.: 11/485,193

(22) Filed: Jul. 11, 2006

(65) Prior Publication Data
US 2008/0014073 A1 Jan. 17, 2008

(51) Int. Cl.
G01N 21/00 (2006.01)

(52) U.S. Cl. .............. 356/235; 356/237.2; 209/509

(58) Field of Classification Search ... 356/237.1–237.6, 356/71, 429–431; 250/559.45, 559.48; 414/728–742, 414/744.1–744.8, 627, 589, 416.1, 749.1–749.6, 414/221.1–226.05, 222.01–222.09; 198/468.2–468.9; 74/34, 89.2; 73/865.8–865.9; 901/40, 7; 269/21, 329, 320; 29/705, 720; 438/14–16, 438/460; 209/552, 559–561, 576, 599, 573, 209/938; 204/198, 224 R, 269
See application file for complete search history.

(56) References Cited
U.S. PATENT DOCUMENTS

| | | | |
|---|---|---|---|
| 4,411,576 A | 10/1983 | Smith et al. | |
| 4,556,362 A | 12/1985 | Bahnck et al. | |
| 4,740,134 A | 4/1988 | Dixon | |
| 4,806,070 A | 2/1989 | Poux et al. | |
| 4,881,863 A | 11/1989 | Braginsky | |
| 5,096,353 A | 3/1992 | Tesh et al. | |
| 5,654,204 A | 8/1997 | Anderson | |

(Continued)

FOREIGN PATENT DOCUMENTS

JP 2004/14923 1/2004

(Continued)

OTHER PUBLICATIONS

International Search Report issued on Apr. 11, 2008 in connection with International Patent Application No. PCT/US2007/015852.

(Continued)

Primary Examiner—Gregory J Toatley, Jr.
Assistant Examiner—Tri T Ton
(74) Attorney, Agent, or Firm—Greenberg Traurig, LLP

(57) ABSTRACT

A robotic die sorter having pick and place arm assemblies and a multi-camera optical inspection system is disclosed. A pick arm of the pick arm assembly picks a die from a semiconductor wafer, and a place arm of the place arm assembly receives the die from the pick arm and places same in a reel of pocketed tape. After picking, the pick arm and the place arm are rotated into facing arrangement, whereupon the die is transferred to the place head of the place arm and a camera of the optical inspection system to detect defects in the die. After inspection, the place arm rotates toward the pocketed tape and places the die into the pocketed tape. Additional cameras of the optical inspection system allow for calibration of the pick and place arms, as well as monitoring of the die transfer process.

15 Claims, 26 Drawing Sheets

U.S. PATENT DOCUMENTS

| | | | |
|---|---|---|---|
| 5,943,551 A | 8/1999 | Schemmel et al. |
| 5,946,409 A | 8/1999 | Hori |
| 6,222,145 B1 | 4/2001 | Cook et al. |
| 6,405,610 B1 | 6/2002 | Komatsu et al. |
| 6,645,355 B2 | 11/2003 | Hanson et al. |
| 6,773,935 B2 | 8/2004 | Watkins et al. |
| 6,892,740 B2 | 5/2005 | Khoon |
| 6,979,165 B2 | 12/2005 | Larson et al. |
| 2001/0000721 A1 | 5/2001 | Buermann |
| 2003/0022401 A1 | 1/2003 | Hamamatsu et al. |
| 2004/0228515 A1 | 11/2004 | Okabe et al. |
| 2005/0041850 A1 | 2/2005 | Watkins et al. |
| 2005/0095090 A1 | 5/2005 | Stone |

FOREIGN PATENT DOCUMENTS

| | | |
|---|---|---|
| JP | 2004 014923 | 1/2004 |
| WO | WO 03/058708 A1 | 7/2003 |

OTHER PUBLICATIONS

Written Opinion issued on Apr. 11, 2008 in connection with International Patent Application No. PCT/US2007/015852.

International Preliminary Report on Patentability issued in International Patent Application No. PCT/US2007/015852 on Jan. 13, 2009.

Steve Belinski, et al., "Intelligent Robot Vision System for Inspection and Assembly of Submillimeter-sized Components", SPIE Automated Inspection and Measurement, 1986, pp. 145-150, vol. 730, Center for Robotic Systems in Microelectronics, University of California, Santa Barbara, California.

Alfred Binder, et al., "Novel Technology for Handling Very Thin Wafers", Solid State Technology, Oct. 2003.

ROBOTIC DIE SORTER WITH OPTICAL INSPECTION SYSTEM

FIELD OF THE INVENTION

The present invention relates to the field of semiconductor die sorters, and, more particularly, to a robotic die sorter having a multi-camera, optical inspection system.

BACKGROUND OF THE INVENTION

In the semiconductor fabrication and processing industries, the ability to quickly and rapidly remove, inspect, and sort dice of semiconductor wafers is of critical importance. Typically, after a wafer has been completed and tested, it is placed onto an adhesive film backing and sawn into individual dice. The individual dice are removed from the mounted wafer and are placed into reels of pocketed tape. Such reels are then shipped for subsequent sales, whereupon the dice are removed from the tape and installed into electronic devices. As will be readily appreciated, the more rapidly and efficiently that dice are sorted, the greater the volume of dice that are shipped from a facility. This, in turn, results in higher profit margins.

Die sorters of various designs exist in the prior art. One example can be found in U.S. Pat. No. 6,222,145 to Cook, et al. (the "Cook, et al. '145 patent"), which discloses a method for sorting integrated circuit chips. A single arm removes ("pick") a chip from a wafer, whereupon the arm is rotated to position the chip above a detector so that the backside of the chip can be inspected. After inspection, the chip is sorted based upon one or more defects detected in the chip, such that the chip is placed into one of a plurality of trays on a moveable surface. The arm includes a vacuum pencil for facilitating removal of a die from a wafer and subsequent inspection and transfer to a tray. Another example of a prior art die sorter can be found in U.S. Pat. No. 5,654,204 to Anderson (the "Anderson '204 patent"), which discloses a die sorter that includes die alignment and probing systems adapted for the removal and inspection of individual dies from wafers.

Existing die sorters suffer from a number of disadvantages. First and foremost, existing die sorters do not operate with sufficient speed, such that dies can be rapidly removed from wafers, inspected, and sorted into reels of pocketed tape. Rather, in traditional pick and place systems, the drive axes (i.e., X-, Y-, Z-, and rotational drive axes) are usually "stacked," such that: (i) the rotational drive motor is carried by a vertical Z-axis drive motor; (ii) the rotational and Z-axis drive motors are carried by a horizontal Y-axis drive motor; and (iii) the rotational, Z-, and Y-axis drive motors are carried by a horizontal X-axis drive motor. Such an arrangement significantly reduces the speed with which the system can operate, primarily because most of the drive motors are required to carry the load of multiple drive axes.

Additionally, existing die sorters do not provide adequate and robust inspection systems, such that the connection side of a die can be inspected after being picked from a wafer and prior to placement in a pocketed tape, and the die can be inspected after placement into the pocketed tape. Rather, in many existing systems, inspection of the connection side of a die is normally performed on a wafer prior to picking. Such an arrangement cannot adequately detect damage to connection points (bumps) of the die or edge chipping that may result from the pick process. Further, while some systems do allow for inspection of a die after a pick process (see, e.g., the Cook, et al. '145 patent), no ability is provided to inspect the die after placement into a pocketed tape. Moreover, existing die sorting systems do not provide an optical inspection system which includes multiple cameras that allow for the aforementioned die inspections, in addition to inspection of pick and place heads so that the heads are precisely calibrated during operation. Accordingly, there is a need to provide a robotic die sorter that address the foregoing limitations.

SUMMARY OF THE INVENTION

The present invention overcomes the disadvantages and shortcomings of the prior art discussed above by providing a robotic die sorter that rapidly and efficiently picks and sorts dice. The robotic die sorter is packaged in a small space so that dice are moved as short a distance as possible to reduce motion time, and the primary axes of the sorter are not stacked in series so as to minimize the total mass moved by associated drive motors. The robotic dies sorter includes a robust, multi-camera optical inspection system for alignment of both dice and pick and place arms of the robotic die sorter, as well as inspection of dice for defects. The die sorter includes an optical inspection system having a pick alignment/inspection camera, which provides alignment information so that a die may be properly aligned at a pick position. A pick arm subassembly having a pick arm picks a die from a semiconductor wafer, and a place arm subassembly having a place arm receives the die from the pick arm and places same in a reel of pocketed tape. The pick arm includes a vacuum nozzle which, with the assistance of a vacuum platform and a vertically-driven needle assembly under the wafer, removes the die from the wafer and retains same in position against the nozzle using suction. After picking, the pick arm and the place arm are rotated into facing arrangement, whereupon the die is transferred to the place arm. After transfer, the connection side of the die is inspected by a handoff alignment/inspection camera of the optical inspection system to determine the location of the die and to detect defects in the die. A place alignment/inspection camera of the optical inspection system determines the position of a corresponding pocket in the pocketed tape into which the die is to be placed. After inspection and any required alignment, the place arm rotates toward the pocketed tape, and places the die into the pocketed tape. After placement into the pocketed tape, the die is inspected by a pocket alignment/inspection camera of the optical inspection system. The optical inspection system thus allows for calibration of the pick and place heads at critical positions.

Further features and advantages of the invention will appear more clearly upon a reading of the following detailed description of various exemplary embodiments thereof, which are given below by way of example only with reference to the accompanying drawings.

BRIEF DESCRIPTION OF THE DRAWINGS

For a better understanding of the present invention, reference is made to the following detailed description of the exemplary embodiments considered in conjunction with the accompanying drawings, in which.

DETAILED DESCRIPTION OF THE DRAWINGS

Figure 1:
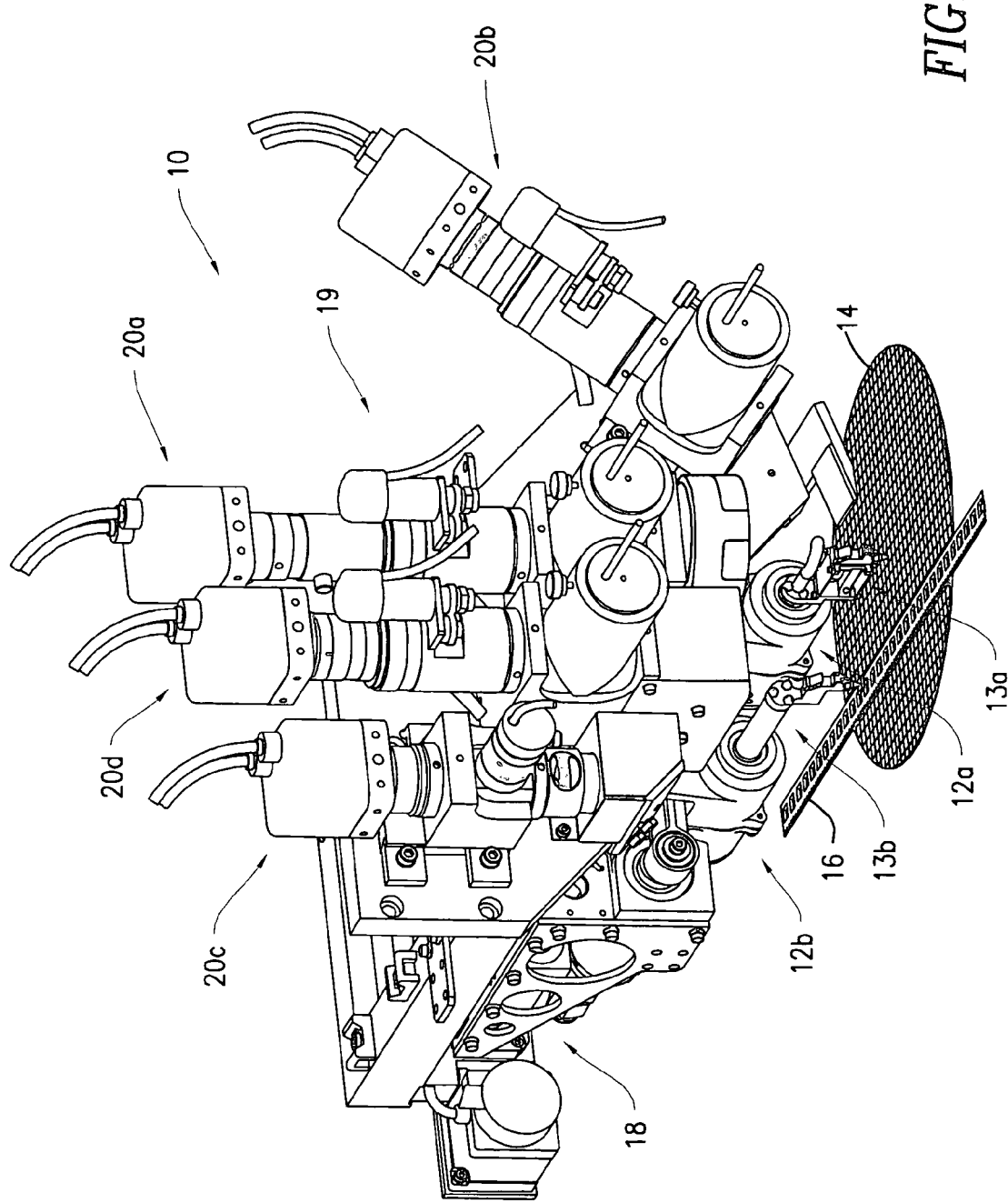
FIG. 1 is a perspective view showing a robotic die sorter constructed in accordance with the present invention.

Referring to FIG. 1, there is shown a die sorter 10 constructed in accordance with the present invention. The die sorter 10 includes a pick arm subassembly 12a, which has a pick arm 13a, and a place arm subassembly 12b, which has a place arm 13b. The pick arm 13a and the place arm 13b cooperate to rapidly remove dice from a semiconductor wafer 14 and to a pocketed tape 16. The pick arm subassembly 12a and the place arm subassembly 12b are mounted to an X-axis linear drive assembly 18. An optical inspection system 19 is also provided, and includes a pick align/inspection camera 20a, a handoff alignment/inspection camera 20b, a pocket alignment/inspection camera 20c, and a place alignment/inspection camera 20d. The functions of each of the cameras 20a-20d will be discussed below in greater detail with respect to FIGS. 19-24.

Figure 2:
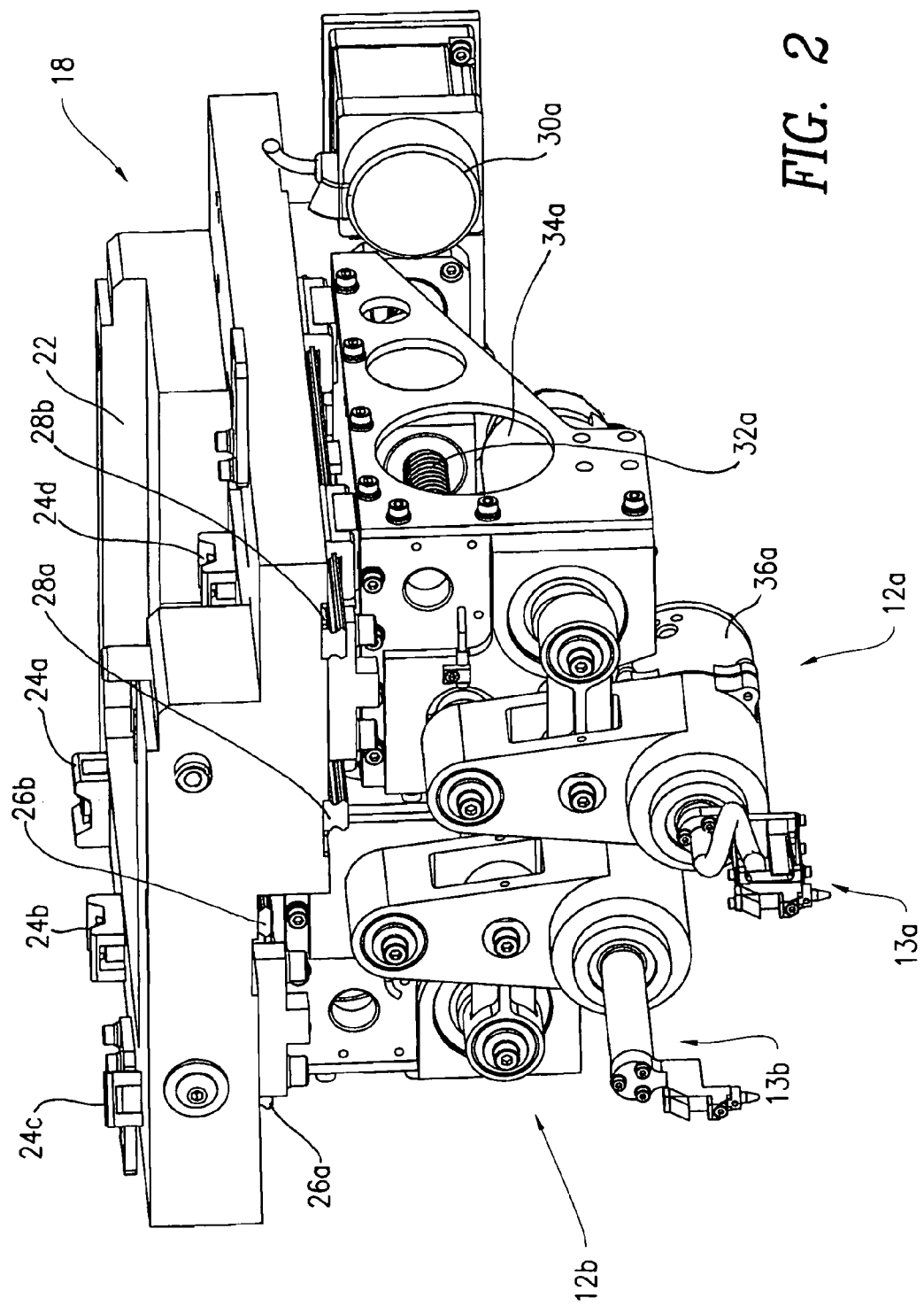
FIG. 2 is a perspective view showing a power drive assembly employed by the robotic die sorter of FIG. 1.
Figure 3:
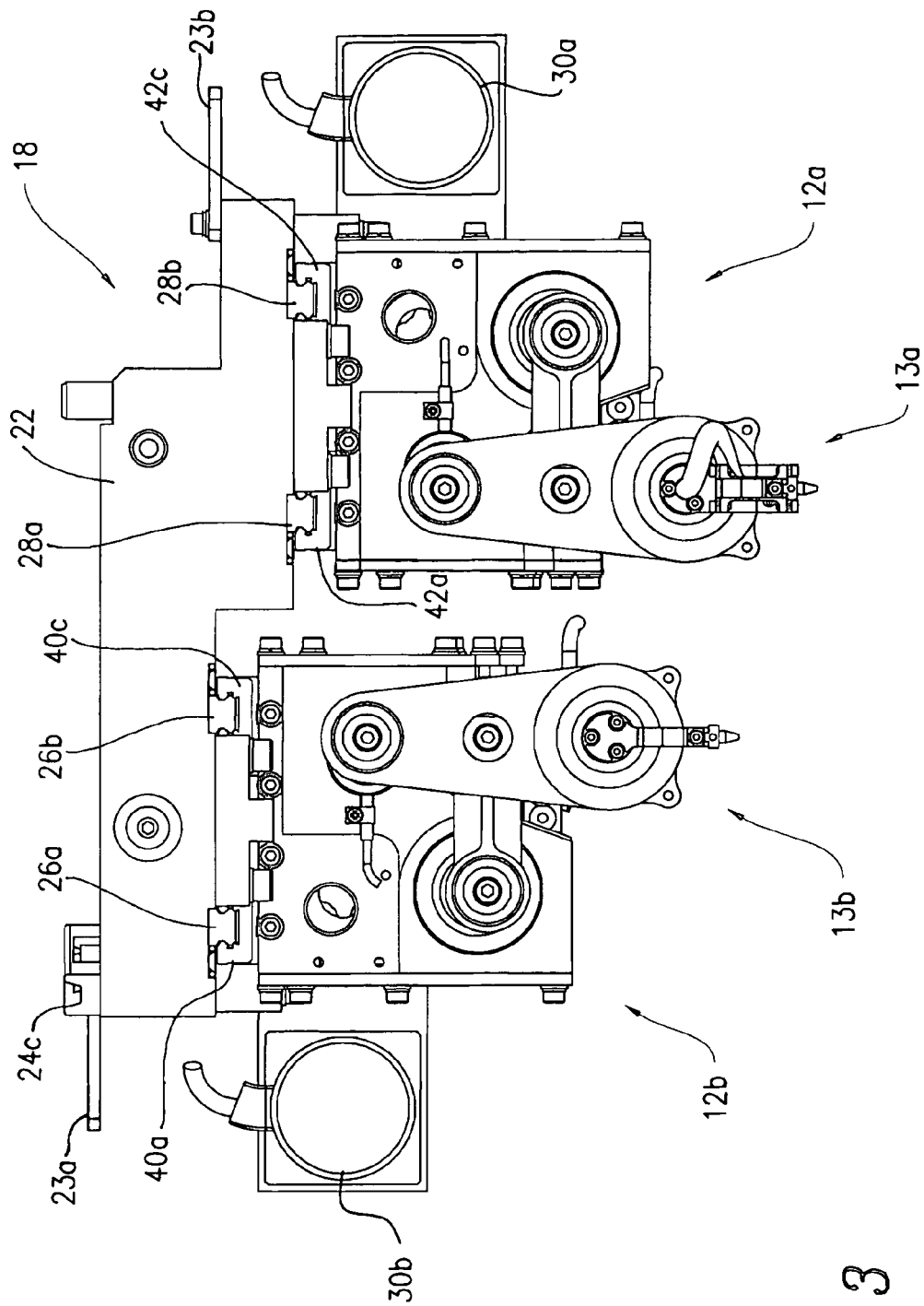
FIG. 3 is a front elevation view of the power drive assembly shown in FIG. 2.
Figure 4:
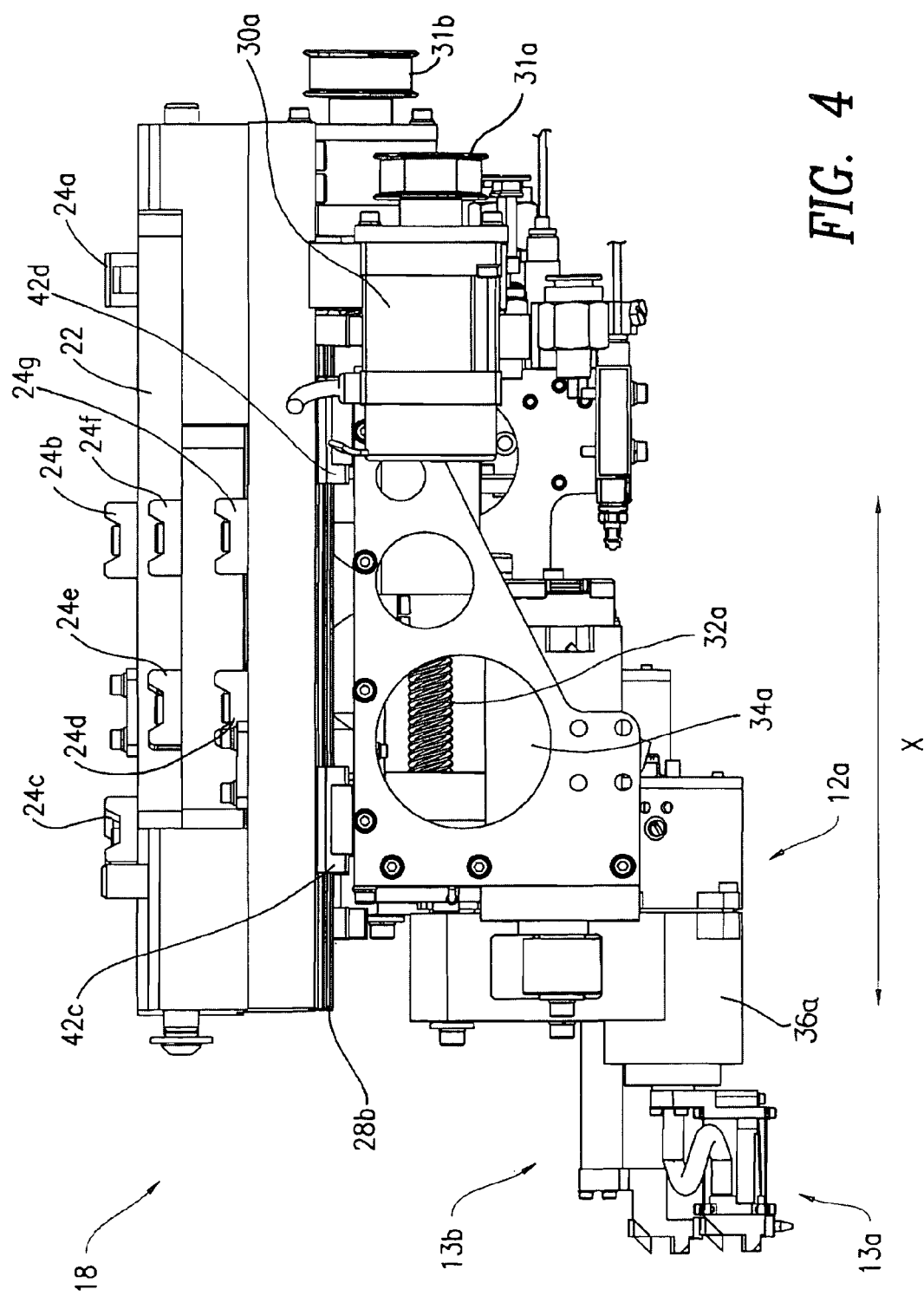
FIG. 4 is a right side elevation view of the power drive assembly shown in FIG. 2.

Referring to FIGS. 2-4, the pick arm subassembly 12a, the place arm subassembly 12b, and the X-axis drive assembly 18 are shown in greater detail. The X-axis drive assembly 18 includes a mounting block 22, which can be mounted in a desired location using dowel pins (not shown). Attached to the mounting block 22 are cable attachment tabs 23a and 23b (see FIG. 3) and a plurality of cable attachment points 24a-24g, to which electrical cabling can be attached. The mounting block 22 includes first and second linear bearing rails 28a and 28b, to which the pick arm subassembly 12a is slideably engaged via pick bearing carriages 42a and 42c (see FIG. 3) and bearing carriage 42d (see FIG. 4). A fourth bearing carriage (not shown) also slideably engages the pick arm subassembly 12a with the linear bearing rail 28b. Such engagement allows linear movement of the pick arm subassembly 12a, and hence the pick arm 13a, with respect to the mounting block 22 along an X axis (see FIG. 4).

The pick arm subassembly 12a is powered by an X-axis drive motor 30a, which is coupled to the pick arm subassembly 12a via a pulley 31a and a conventional screw drive 32a (see FIG. 4). A belt (not shown) couples the pulley 31a to the screw drive 32a. As will be discussed in greater detail below with respect to FIGS. 7-10, the pick arm assembly 12a includes a Y-axis drive motor 34a and a rotational motor 36a for allowing additional linear and rotational movement of the pick arm 13a (see FIG. 4). As will be discussed below, a rotary optical encoder mounted on one end of the X-axis drive motor 30a provides position feedback for the X axis. X-axis limit switches (not shown) are also provided for defining and signaling the limits of X-axis motion of the pick arm subassembly 12a with respect to the mounting block 22.

Figure 5:
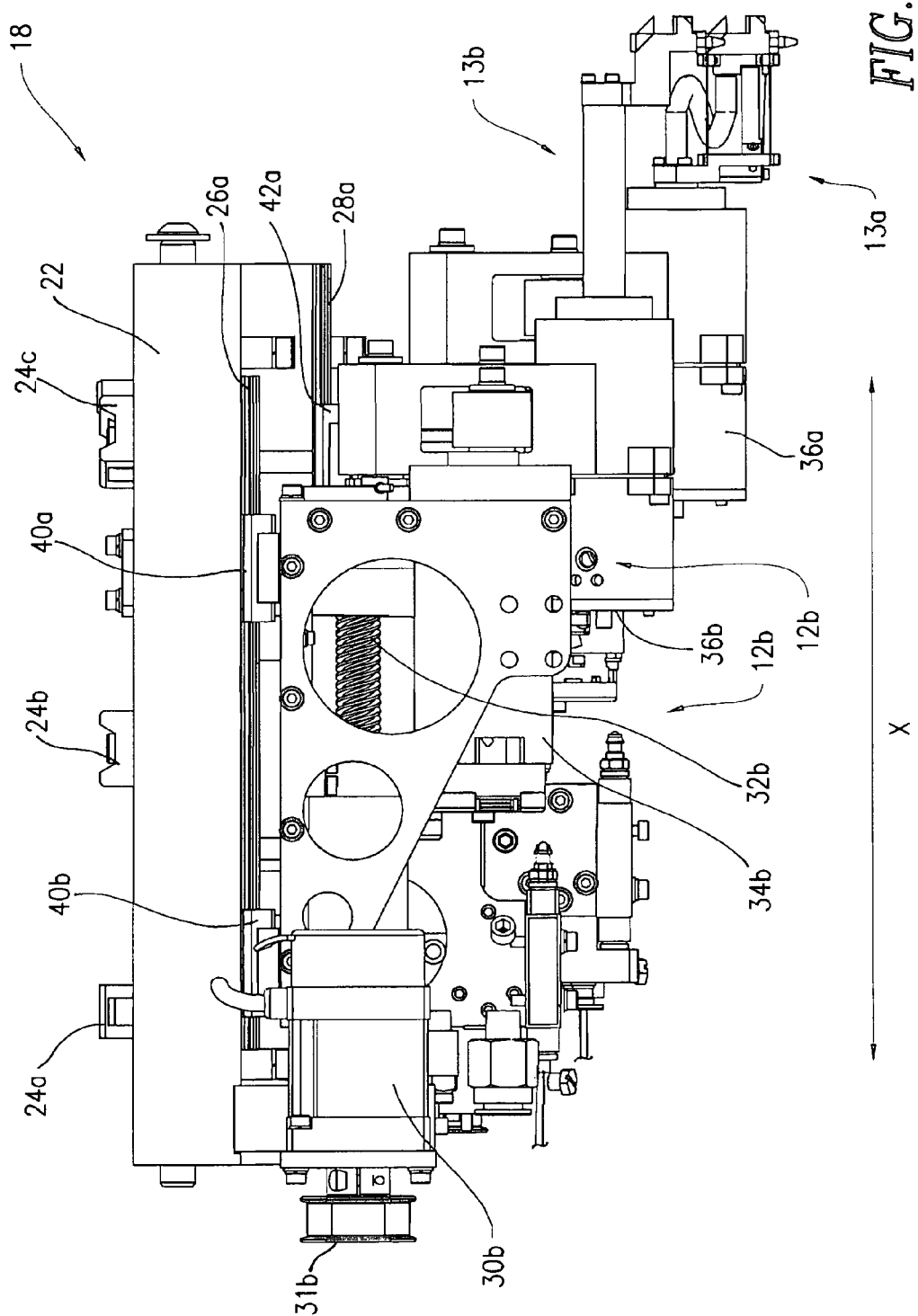
FIG. 5 is a left side elevation view of the power drive assembly shown in FIG. 2.

Referring to FIGS. 2, 3, and 5, the mounting block 22 includes third and fourth linear bearing rails 26a and 26b, to which the place arm subassembly 12b is slideably engaged via linear bearing cages 40a-40c. A fourth linear bearing carriage (not shown) also slideably engages the place arm subassembly 12b with the drive rail 26b. As with the pick arm subassembly 12a, such engagement allows linear movement of the place arm subassembly 12b, and hence the place arm 13b, with respect to the mounting block 22 along the X axis (see FIG. 5). The place arm subassembly 12b is moved by an X-axis drive motor 30b, which is coupled to the place arm subassembly 12b via a pulley 31b and a conventional screw drive 32b (see FIG. 5). A belt (not shown) couples the pulley 31b to the screw drive 32b. As will be discussed in greater detail below with respect to FIGS. 11-14, the place arm subassembly 12b includes a Y-axis drive motor 34b and a rotational motor 36b for allowing additional linear and rotational movement of the place arm 13b. (see FIG. 5) As will be discussed below, a rotary optical encoder (not shown) mounted on the end of the X-axis drive motor 30a provides position feedback for the X-axis. X-axis limit switches (not shown) are also provided for defining and signaling the limits of X-axis motion of the place arm subassembly 12b with respect to the mounting block 22.

Figure 6A:
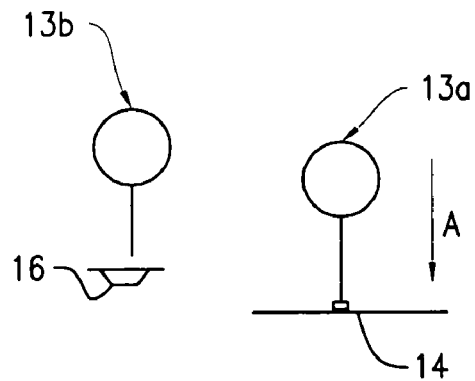
FIGS. 6a-6e are schematic diagrams showing die removal, transfer, and placement motions achieved by the present invention.
Figure 6B:
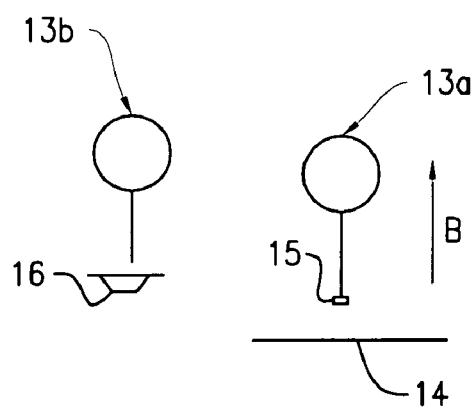
Figure 6C:
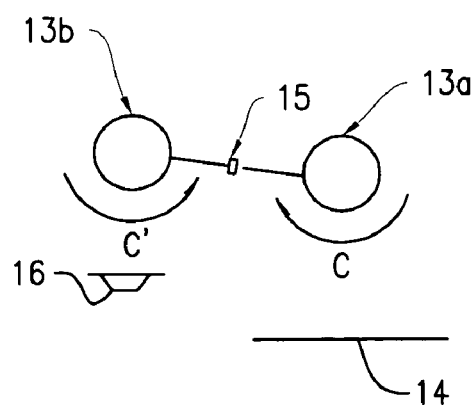
Figure 6D:
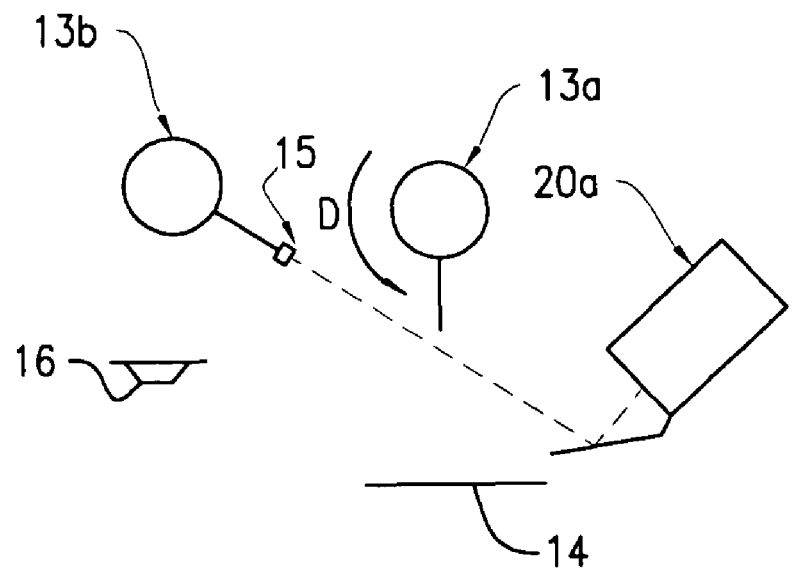

As shown schematically in FIGS. 6a-6e, the pick arm 13a and the place arm 13b allow for the rapid removal of dies from the wafer 14 and the subsequent placement of the dies in pockets of the pocketed tape 16. Beginning in FIG. 6a, the pick arm 13a is moved downwardly (in the general direction indicated by arrow A) to contact a desired die 15 (see FIG. 6b) on the wafer 14. The die is assisted upward by a vertically-driven needle (not shown) which is synchronized with the pick arm 13a. The tape to which the die is attached can be retained in position by a vacuum platform (not shown) positioned underneath the wafer 14. When the die contacts the pick arm 13a, suction is applied at the pick arm 13a to maintain the die in position against the pick arm 13a. Then, as shown in FIG. 6b, the pick arm 13a is raised upwardly (in the general direction indicated by arrow B), thereby removing the die from the wafer 14. As shown in FIG. 6c, after the pick arm 13a has been raised, both the pick arm 13a and the place arm 13b are rotated inwardly (in the general direction indicated by arrows C and C', respectively). The place arm 13b is moved along a linear path perpendicular to the surface of the die, such that place arm 13b contacts the die. Suction is applied to the place arm 13b, and suction at the pick arm 13a is released and a slight positive pressure is applied to the pick arm 13a, causing the die 15 is transferred from the pick arm 13a to the place arm 13b. Then, as shown in FIG. 6d, the pick arm 13a is rotated outwardly (in the general direction indicated by arrow D), so that the die 15 is visible by the post-pick inspection camera 20b. This facilitates a rapid inspection of the die 15 to determine the true location of the die on the place arm 13a after hand-off and to check for defects in the die 15. If the die 15 is found to be defective, it can be quickly discarded by the place arm 13b (i.e., by moving the place arm 13b to a position where rejected dies are collected, releasing the defective die, and moving the place arm 13b back to its original position). Thereafter, a new die would be removed from the wafer 14 by the pick arm 13a and transferred to the place arm 13b for inspection. During hand-off, an image of the tape pocket that the die will be placed into is taken by the pocket alignment/inspection camera 20c (see FIG. 1). This image and the image taken by the handoff alignment/inspection camera 20b (see FIG. 1) are compared to trained images stored in a motion control system associated with the robotic die sorter 10, and any required correction is determined and implemented.

Figure 6E:
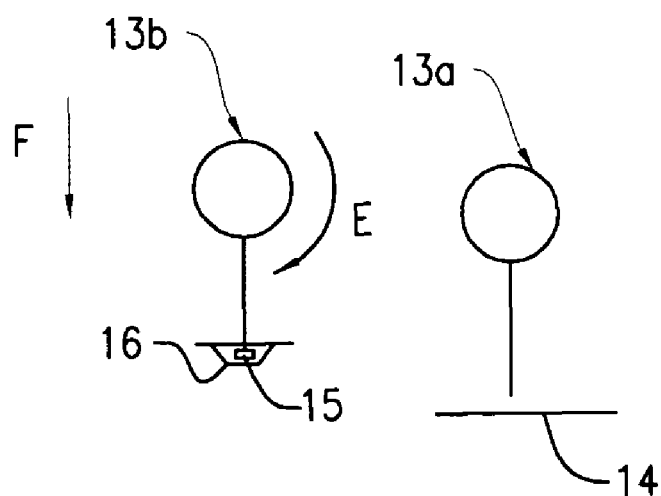
Figure 7:
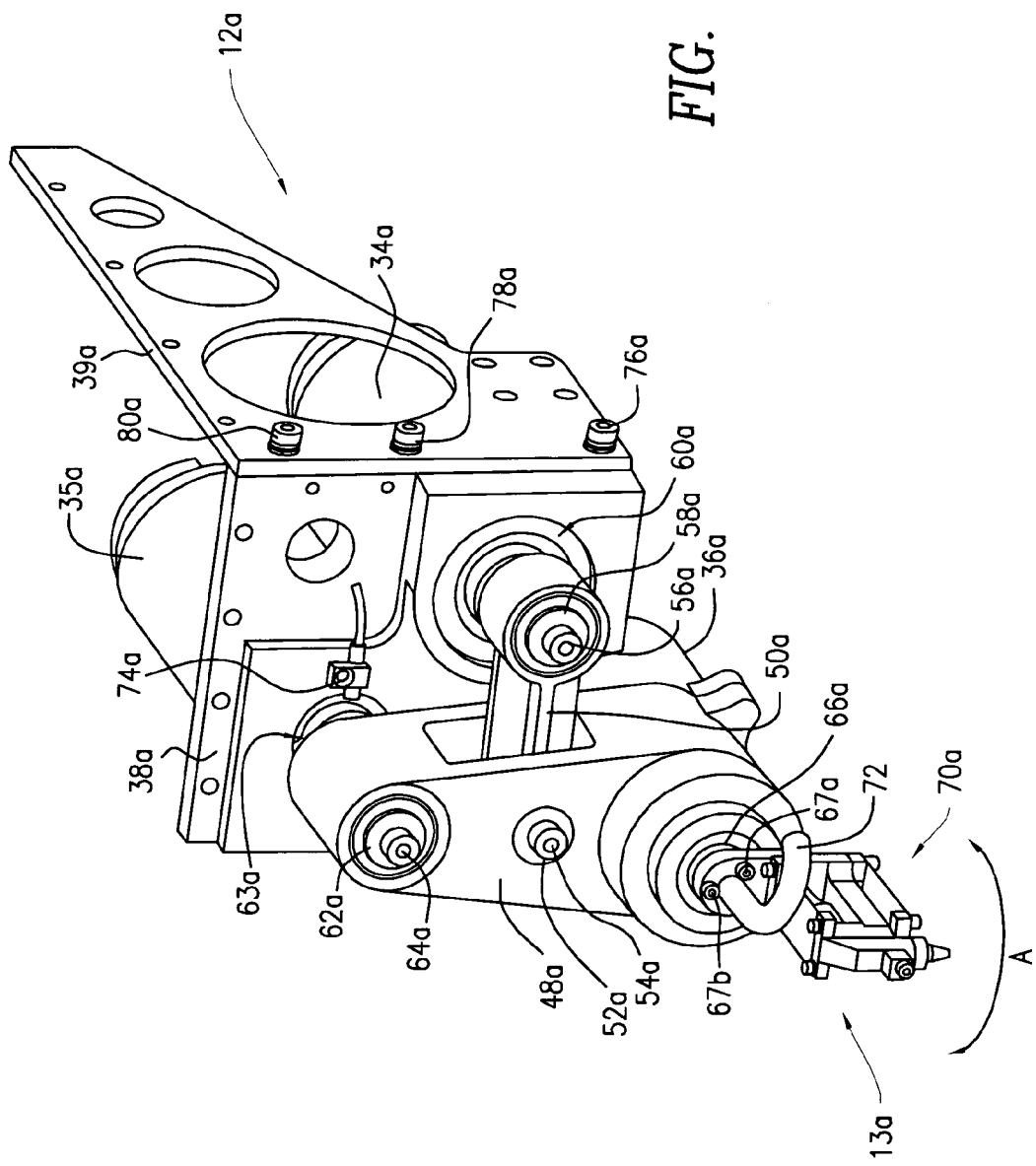
FIG. 7 is a partial perspective view showing a pick arm subassembly employed by the power drive assembly of FIGS. 2-5.
Figure 8:
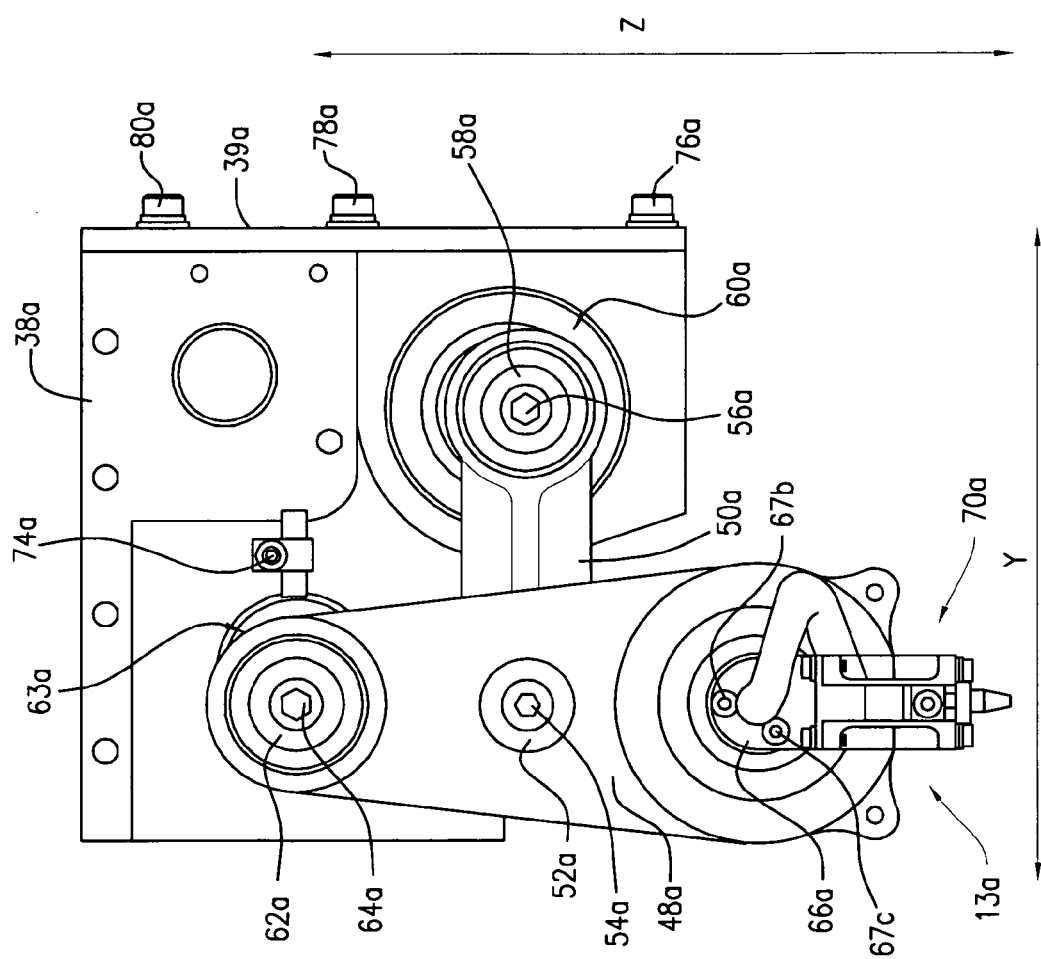
FIG. 8 is a front elevation view of the pick arm subassembly shown in FIG. 7.
Figure 9:
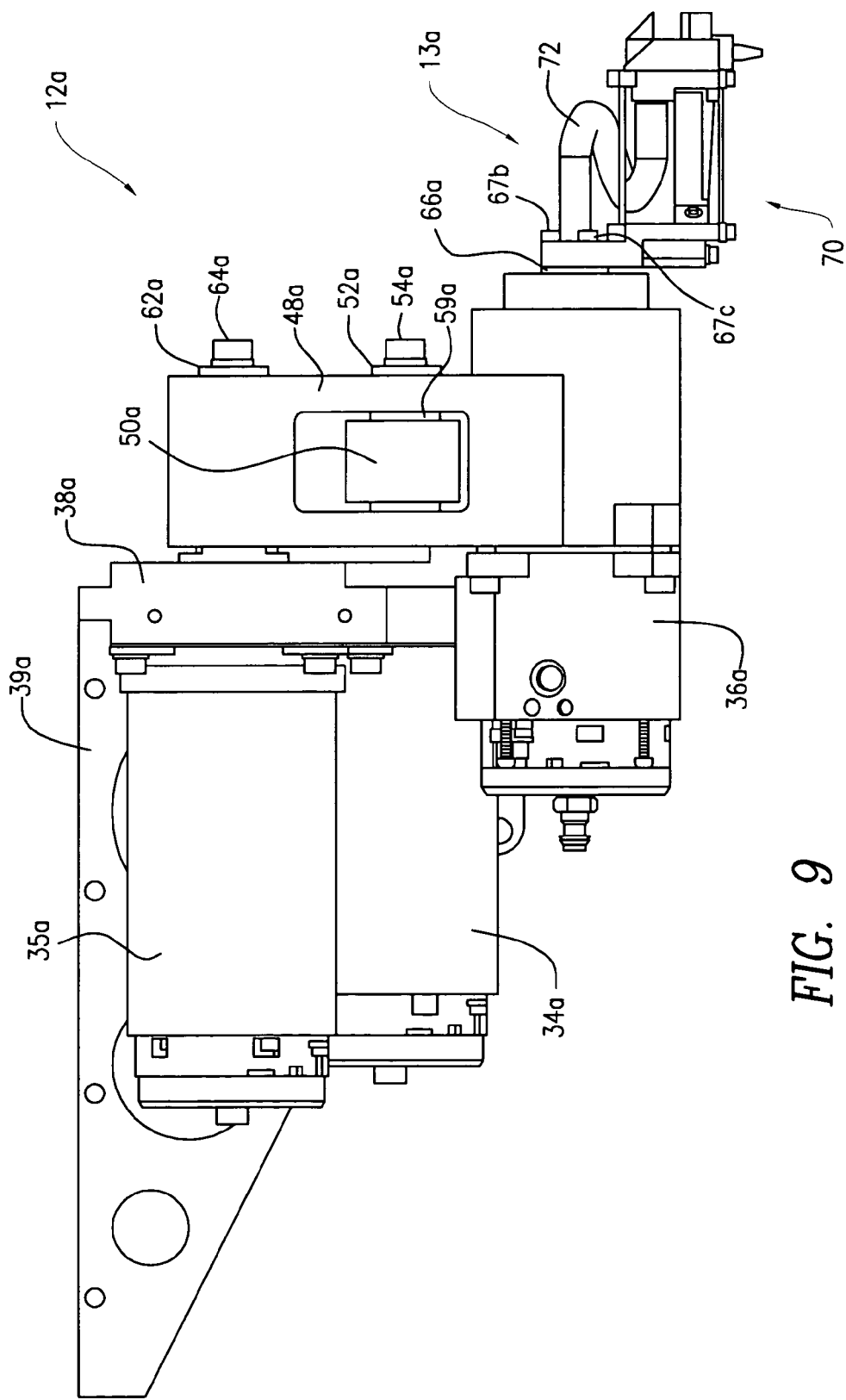
FIG. 9 is a left side elevation view of the pick arm subassembly shown in FIG. 7.
Figure 10:
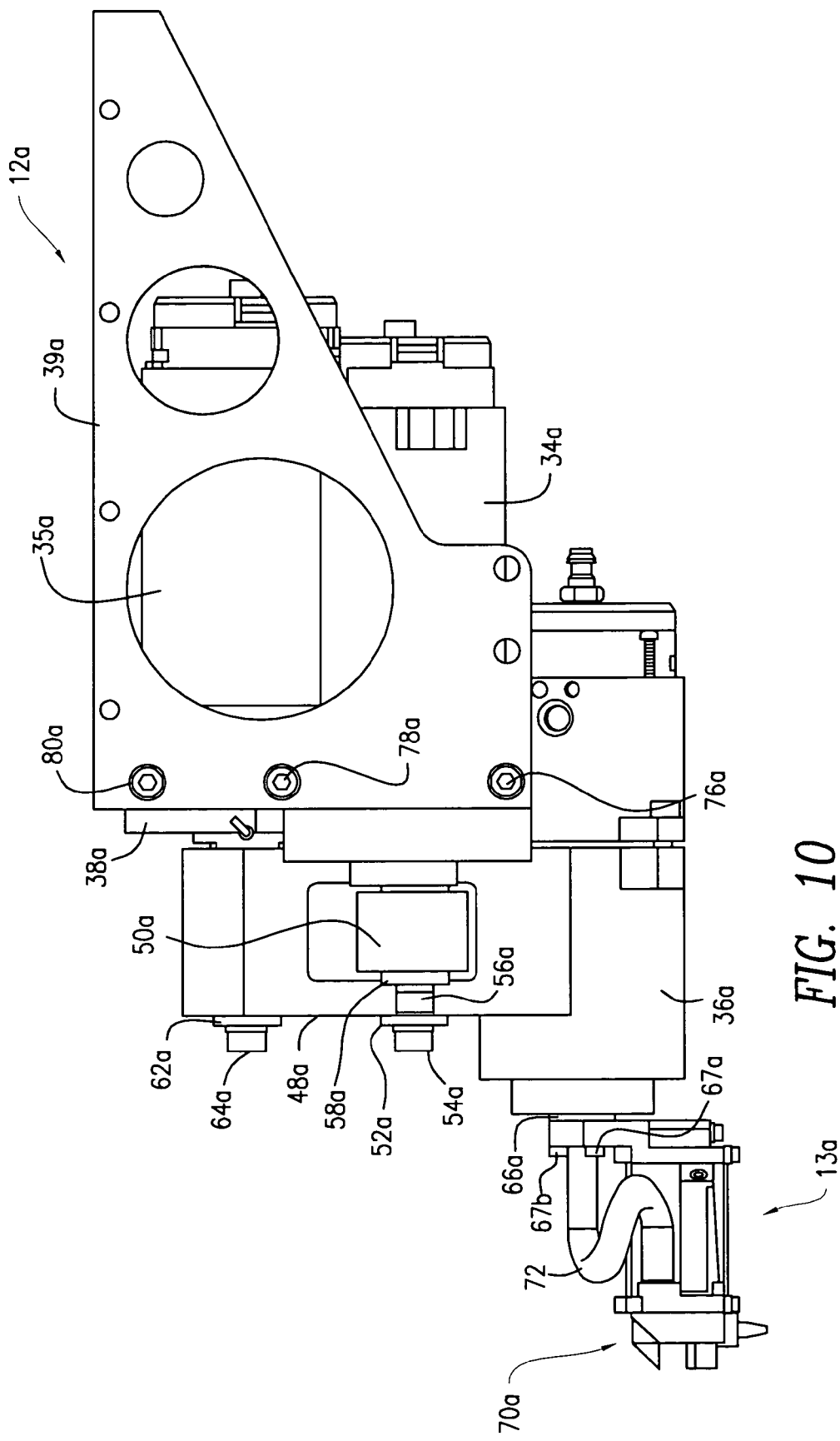
FIG. 10 is a right side elevation view of the pick arm subassembly shown in FIG. 7.
Figure 11:
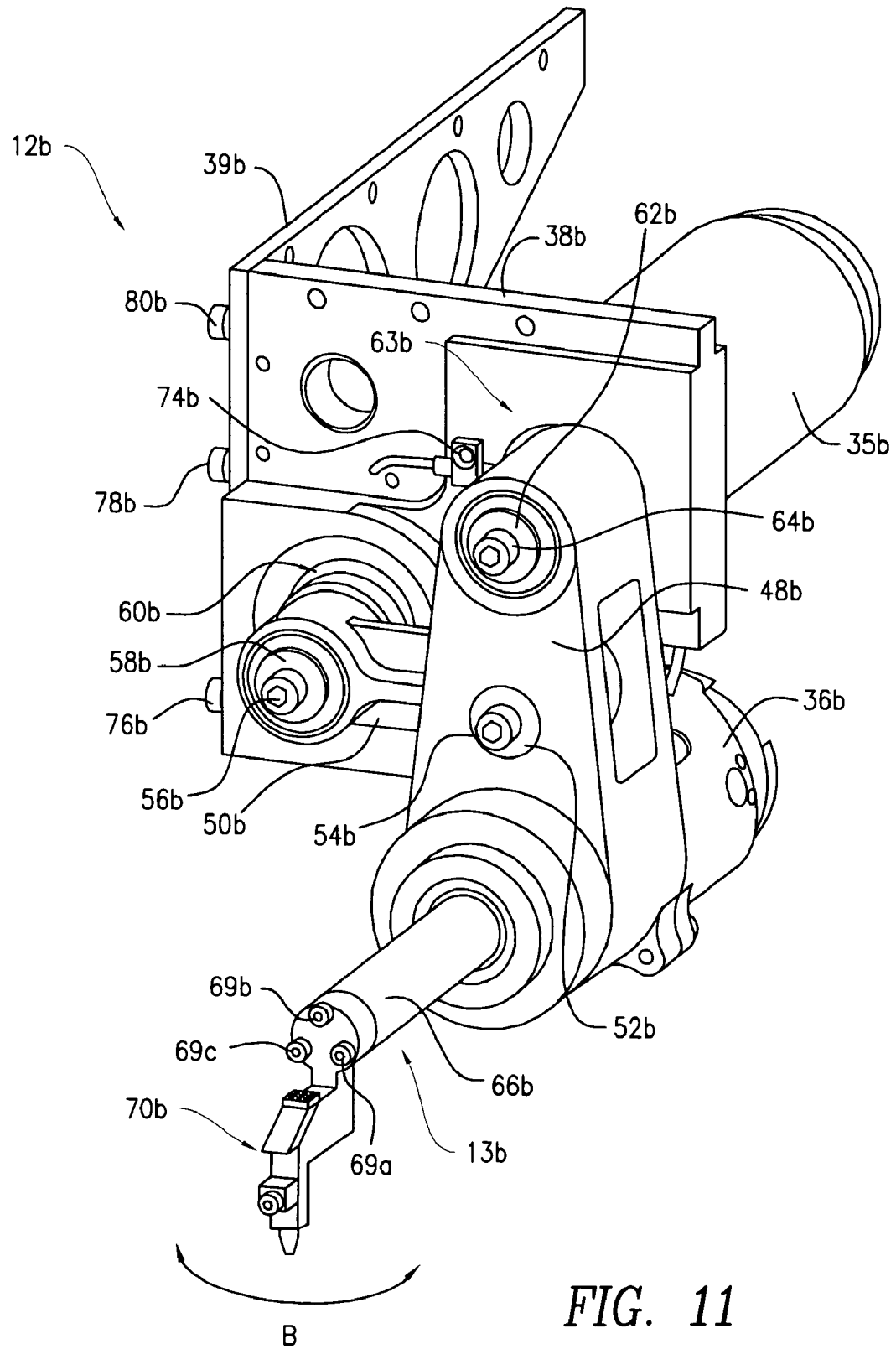
FIG. 11 is a partial perspective view showing the place arm subassembly employed by the power drive assembly of FIGS. 2-5.
Figure 12:
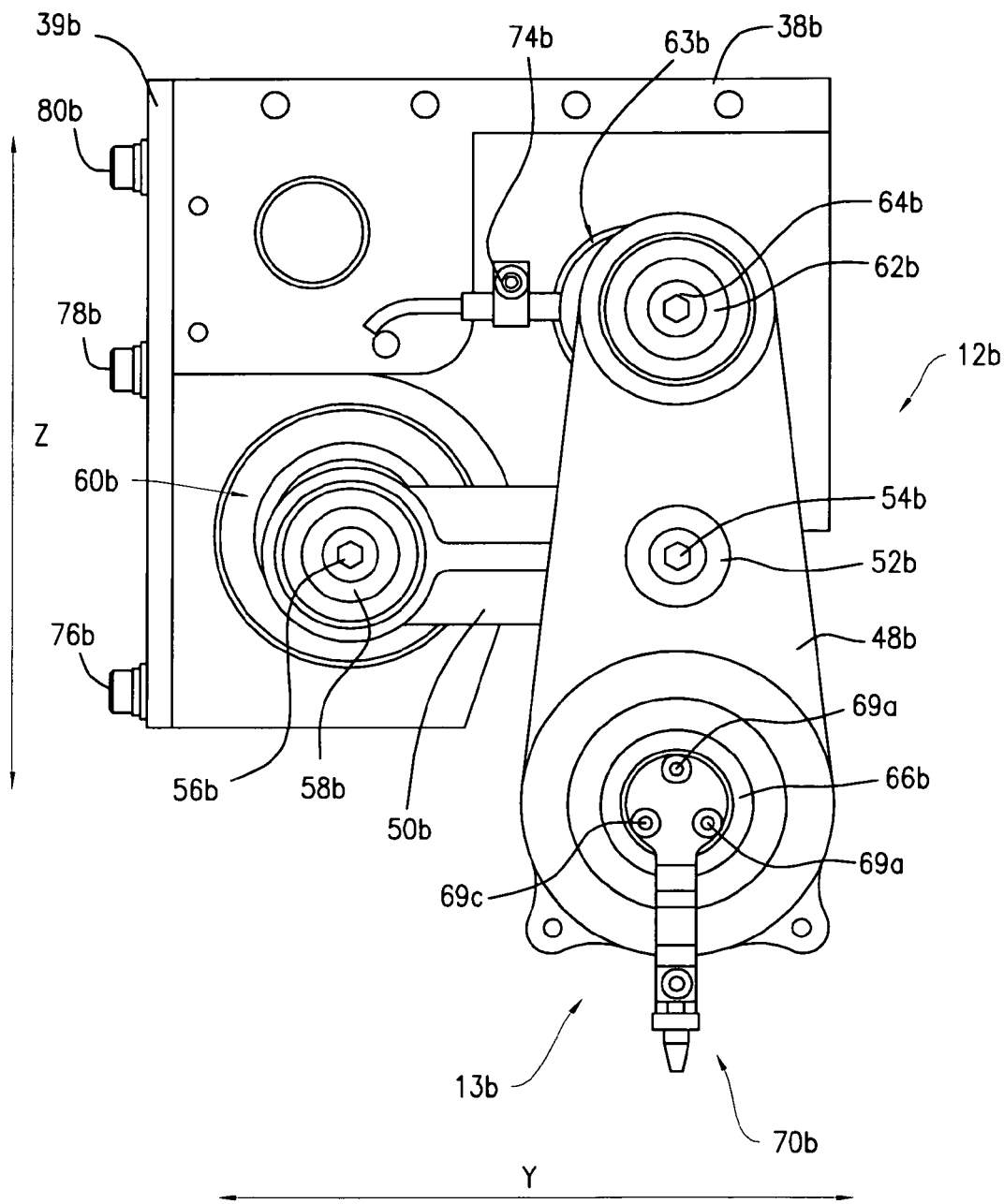
FIG. 12 is a front elevation view of a place arm subassembly shown in FIG. 7.
Figure 13:
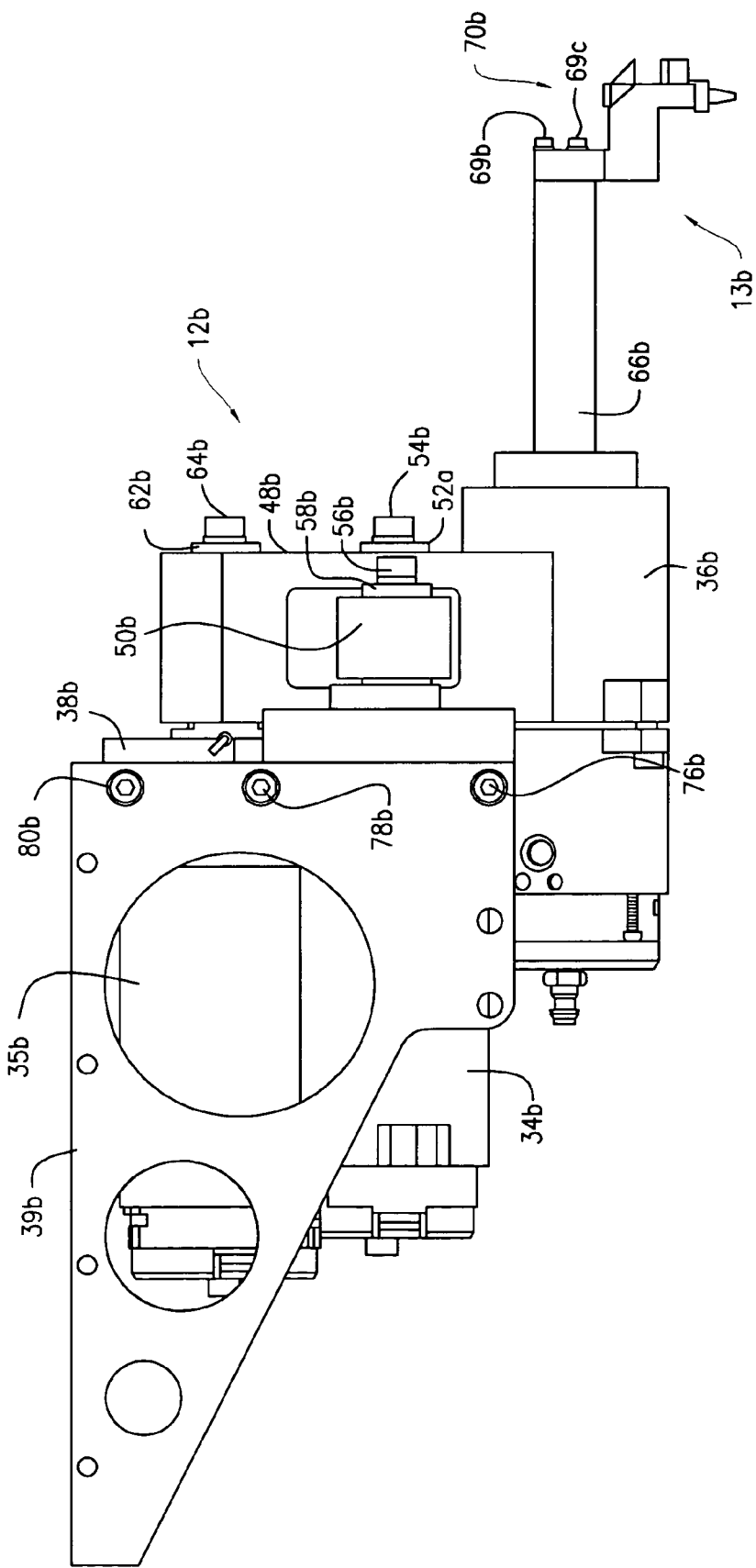
FIG. 13 is a left side elevation view of the place arm subassembly shown in FIG. 11.
Figure 14:
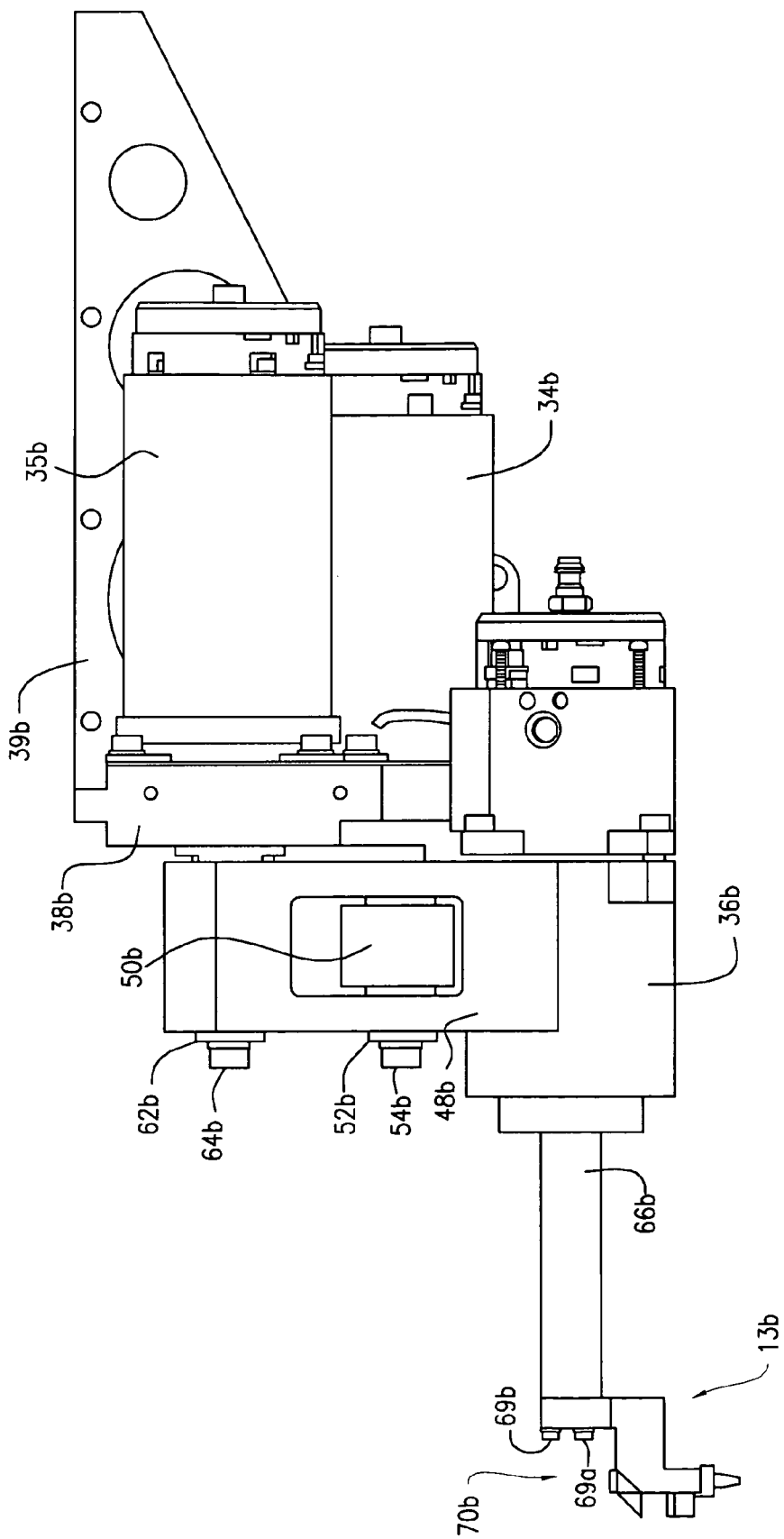
FIG. 14 is a right side elevation view of the place arm subassembly shown in FIG. 11.

As shown in FIG. 6e, if the die 15 is determined to be acceptable (i.e., the die 15 does not contain any defects), the place arm 13b is rotated outwardly (in the general direction indicated by arrow E). Any correction determined by the cameras 20b and 20c (see FIG. 1) is applied by moving the place arm 13b from a nominal place position in the X and Y plane. When the place arm 13b is in the corrected position, the place arm 13b is moved downwardly (in the general direction indicated by arrow F), so that the die 15 is placed in a corresponding pocket of the pocketed tape 16. The process depicted in FIGS. 6a-6e thus allows for the quick transfer of the die 15 from the wafer 14 to the pocketed tape 16, as well as quality inspection of the die 15 and correction for position errors of the die and tape prior to placement into the pocketed tape 16. As will be readily appreciated, this process can be repeated with a high degree of speed and precision, so that all dies in the wafer 14 can be inspected and transferred to the pocketed tape 16.

Referring now to FIGS. 7-10, the construction of the pick arm subassembly 12a is shown in greater detail. The pick arm subassembly 12a includes mounting plates 38a and 39a, which are fastened together along an edge via fasteners 76a, 78a, and 80a to provide a generally L-shaped bracket. It should be noted that a unitary, L-shaped bracket could also be provided. A second plate (not shown) identical to the mounting plate 39a is mounted on an opposite side of the plate 38a. The Y-axis drive motor 34a is mounted to the mounting plate 38a. The Y-axis drive motor 34a is in mechanical communication with an eccentric drive 60a. The eccentric drive 60a is coupled to one end of a linkage 50a via a fastener 56a, which extends through a washer 58a and a corresponding aperture (not shown) in the linkage 50a, and is fastened to the eccentric drive 60a. An opposite end of the linkage 50a is coupled to an arm 48a via a fastener 54a and a bushing 59a, both of which extend through an aperture (not shown) in the linkage 50a, such that the linkage 50a pivots with respect to the arm 48a and about the bushing 59a. The fastener 54a extends through an aperture (not shown) in the arm 48a, the washer 52a, and the bushing 59a, and is fastened to the linkage 50a. A Z-axis drive motor 35a is also mounted to the mounting plate 38a. The Z-axis drive motor 35a is in mechanical communication with an eccentric drive 63a. The eccentric drive 63a is coupled to one end of the arm 48a via a fastener 64a, which extends through a washer 62a and a corresponding aperture (not shown) in the arm 48a, and is fastened to the eccentric drive 63a. The Y-axis motor 34a, the Z-axis motor 35a, the eccentric drives 60a and 63a, the linkage 50a, and the arm 48a cooperate to allow motion of the pick arm 13a in horizontal and vertical directions, as indicated by the arrows Y and Z in FIG. 8. As will be discussed below, optical rotary encoders mounted on the end of each of the motors 34a and 35a provides position feedback for these axes. A separate channel of the encoder with a single pulse per revolution is used with a programmed offset to set the home or zero position for each axis. A switch 74a is used to determine the correct direction to move the Z axis before any of the axes have been moved (i.e., zero position set) so that the system may be started without driving the pick arm 13a into the wafer 14 (see FIG. 1). Such switches could include mechanical, electrical, optical, or inductive limit switches known in the art.

As shown in FIGS. 7-10, the pick arm subassembly 12a also includes a rotational (theta) motor 36a, which is mounted to the arm 48a. The rotational motor 36a includes a shaft 66a, to which the pick arm 13a is mounted via fasteners 67a-67c. The pick arm 13a includes a pick head 70a mounted to an end thereof, in addition to a vacuum hose 72 connected to the pick head 70a. The pick head 70a will be described in greater detail below with respect to FIGS. 15 and 16. The rotational motor 36a allows the pick arm 13a to be rotated about an axis, in the general direction indicated by arrow A (see FIG. 7). Motion of the rotational motor 36a is monitored by an incremental optical rotary encoder (not shown) mounted on the end of the motor 36a opposite the pick head 70a. Thus, as will be readily appreciated, the pick arm assembly 12a, in conjunction with the X-axis drive assembly 18 discussed above with respect to FIGS. 2-5, allows the pick arm 13a to be moved along three linear axes (X, Y, and Z axes), as well as to be rotated about an axis. True linear Y and Z motions are created by combined motions of motors 34a, 35a, and 36a.

Referring now to FIGS. 11-14, the construction of the place arm subassembly 12b is shown in greater detail. The place arm subassembly 12b includes mounting plates 38b and 39b, which are fastened together along an edge via fasteners 76b, 78b, and 80b to provide a generally L-shaped bracket. It should be noted that a unitary, L-shaped bracket could also be provided. The Y-axis drive motor 34b is mounted to the mounting plate 38b. The Y-axis drive motor is in mechanical communication with an eccentric drive 60b. The eccentric drive 60b is coupled to one end of a linkage 50b via a fastener 56b, which extends through a washer 58b and a corresponding aperture (not shown) in the linkage 50b, and is fastened to the eccentric drive 60b. An opposite end of the linkage 50b is coupled to an arm 48b via a fastener 54b and a bushing 59b, both of which extend through an aperture (not shown) in the linkage 50b, such that the linkage 50b pivots with respect to the arm 48b and about the bushing 59b. The fastener 54b extends through an aperture (not shown) in the arm 48b, the washer 52b, and the bushing 59b, and is fastened to the linkage 50a. A Z-axis drive motor 35b is also mounted to the mounting plate 38b. The Z-axis drive motor 35b is in mechanical communication with an eccentric drive 63b. The eccentric drive 63b is coupled to one end of the arm 48b via a fastener 64b, which extends through a washer 62b and a corresponding aperture (not shown) in the arm 48b, and is fastened to the eccentric drive 63b. The Y-axis motor 34b, the Z-axis motor 35b, the eccentric drives 60b and 63b, the linkage 50b, and the arm 48b cooperate to allow motion of the place arm 13b in horizontal and vertical directions, as indicated by the arrows Y and Z in FIG. 12. An incremental optical rotary encoder (not shown) mounted on the end of each of the motors 34b and 35b provides position feedback for these axes. A separate channel of the encoder with a single pulse per revolution is used with a programmed offset to set the home (or zero) position for each axis. A switch 74b is used to determine the correct direction to move the Z axis before any of the axes have been homed (i.e., zero position set), so that the system may be started without driving the pick arm 13a into the wafer 14 (see FIG. 1). Such switches could include mechanical, electrical, optical, or inductive limit switches known in the art.

As shown in FIGS. 11-14, the place arm assembly 12b also includes a rotational (theta) motor 36b, which is mounted to the arm 48b. The rotational motor 36b includes a shaft 66b, to which the place arm 13b is mounted via fasteners 69a-69c. The place arm 13b includes a place head 70b mounted to an end thereof. The place head 70b will be described in greater detail below with respect to FIGS. 17-18. The rotational motor 36b allows the place arm 13b to be rotated about an axis, in the general direction indicated by arrow B (see FIG. 11). Motion of the rotational motor 36b is monitored by an incremental optical rotary encoder mounted on an end of the motor 36b opposite the pick head 70b. Thus, as will be readily appreciated, the place arm assembly 12b, in conjunction with the X-axis drive assembly 18 discussed above with respect to FIGS. 2-5, allows the place arm 13a to be moved along three linear axes (X, Y, and Z axes), as well as to be rotated about an axis. True linear Y and Z motions are created by combined motions of motors 34a, 35a, and 36a.

The X-axis drive motors 30a, 30b of the present invention each could include the Parker model BE162 brushless servo motor manufactured by Parker, Inc., which includes an integral encoder for monitoring motor movements and for providing position feedback to be used by a motion controller. The Y-axis drive motors 34a, 34b and the Z-axis drive motors 35a, 35b of the present invention each could include the Emoteq model QB1702 brushless, frameless servo motor manufactured by Emoteq, Inc., coupled with a Renco model R35i commutation encoder manufactured by Renco, Inc. for monitoring motor movements and for providing position feedback to be used by a motion controller. The rotational motors 36a, 36b of the present invention each could include the Emoteq model QB1702 brushless, frameless servo motor manufactured by Emoteq, Inc., coupled with a MicroE Systems Mercury 2000 model programmable encoder manufactured by MicroE Systems, Inc. for monitoring motor movements and for providing position feedback to be used by a motion controller. Any other suitable motors and associated encoders/sensors could be substituted without departing from the spirit or scope of the present invention.

Each of the motors 30a-30b, 34a-34b, 35a-35b, and 36a-36b, in addition to their associated encoders/sensors, is capable of being interfaced with a commercially-available motion controller, such as the Delta Tau Turbo PMAC II programmable motion control system manufactured by Delta Tau Data Systems, Inc. The Turbo PMAC II programmable motion control system allows for central control of all motions of the present invention (i.e., X-axis, Y-axis, Z-axis, and rotational motion) using a programmable Cartesian coordinate system to describe desired motions. Using a series of kinematic equations, the PMAC system automatically calculates and actuates required motor movements to achieve the desired motions. For example, if the pick arm 13a is at a start position having Cartesian coordinates of 0,0,0,0 (representing X, Y, and Z axis coordinates, respectively, in addition to a desired angle of rotation, in degrees) and it is desired to move the pick arm 13a to Cartesian coordinates 1,2,3,45, such start and end position coordinates are programmed into the PMAC system. The PMAC system then calculates an appropriate motion path using a series of kinematic equations, and automatically actuates the drive motors 30a-30b, 34a-34b, 35a-35b, and 36a-36b so as to move the pick arm 13a from the start position to the desired end position. In such fashion, a plurality of motion control programs can be written, stored, and executed by the PMAC system for implementing desired motions, such as the die transfer operations performed by the present invention. It should be noted that any other, suitable motion control system could be implemented without departing from the spirit or scope of the present invention.

Figure 15:
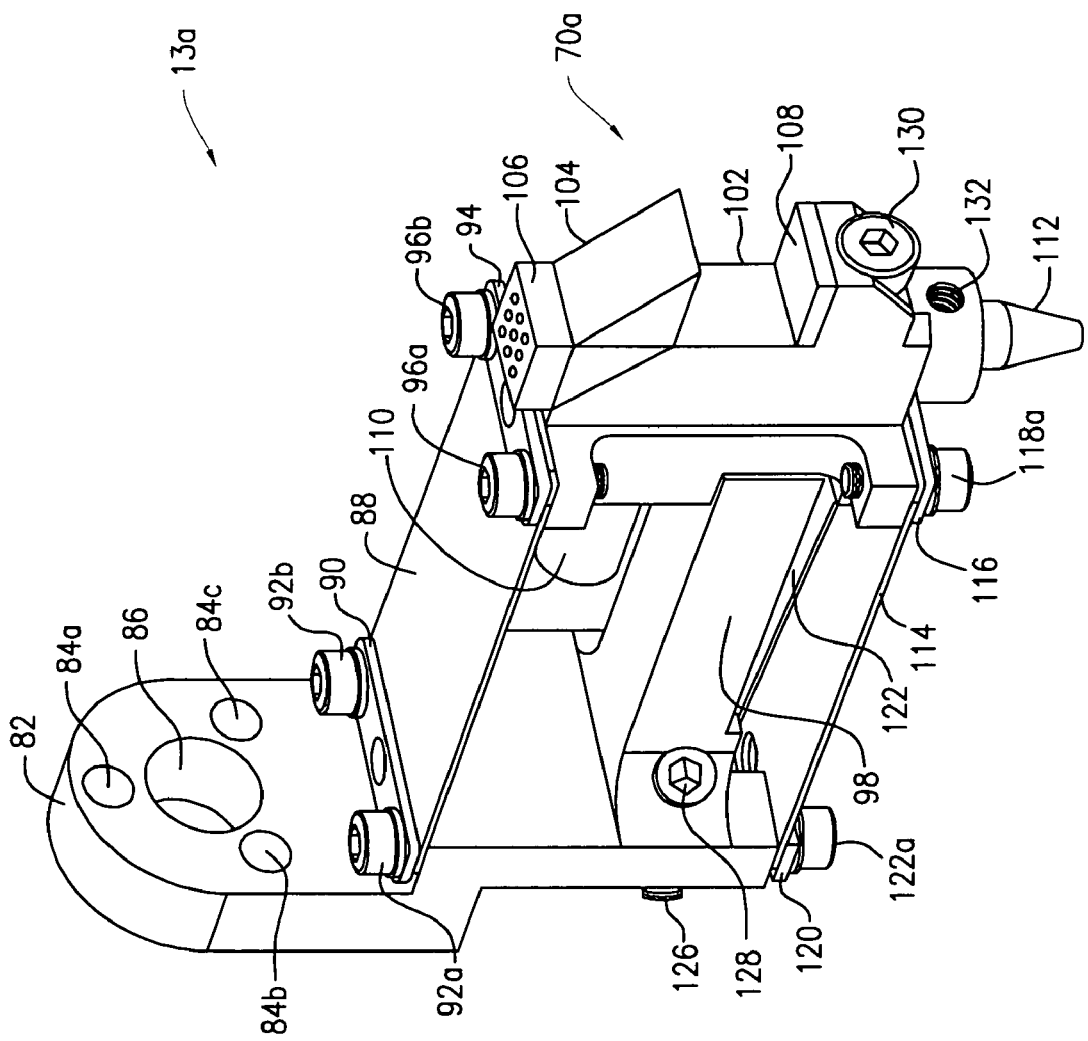
FIG. 15 is a perspective view showing a pick arm employed by the pick arm subassembly shown in FIGS. 7-10.
Figure 16:
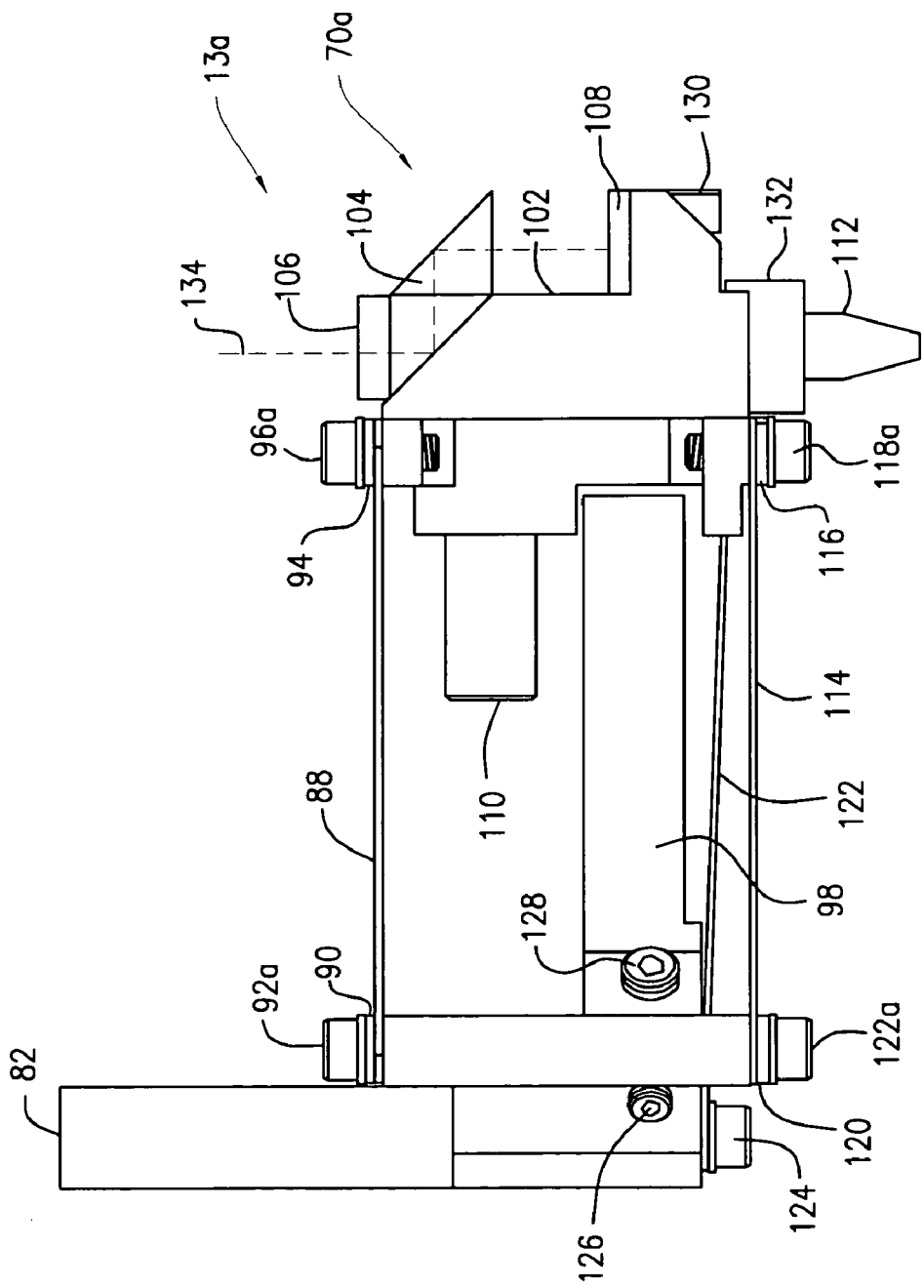
FIG. 16 is a left side elevation view of the pick arm shown in FIG. 15.

Referring to FIGS. 15 and 16, the pick arm 13a is shown in greater detail. The pick arm 13a includes the pick head 70a, a bracket 82, horizontal plates 88 and 114 interconnecting the pick head 70a and the bracket 82, an arm portion 98, and a tension arm 122. The bracket 82 includes mounting apertures 84a-84c, which receive the fasteners 67a-67c, respectively, for fastening the pick arm 13a to the shaft 66a (see FIGS. 7-10). One end of the horizontal plate 88 is mounted to the bracket 82 via a mounting plate 90 and apertures 92a and 92b, which extend through corresponding apertures (not shown) formed in the mounting plate 90 and the horizontal plate 88 and are fastened to the bracket 82. The opposite end of the horizontal plate 88 is mounted to the pick head 70a via a mounting plate 94 and apertures 96a and 96b, which extend through corresponding apertures (not shown) in the mounting plate 94 and the horizontal plate 88 and are fastened to the pick head 70. Similarly, one end of the horizontal plate 114 is mounted to the bracket 82 via a mounting plate 120, a fastener 122a, and a second fastener (not shown), both of which fasteners extend through corresponding apertures (not shown) formed in the mounting plate 120 and the horizontal plate 114 and are fastened to the bracket 82. The opposite end of the horizontal plate 114 is mounted to the pick head 70a via a mounting plate 116, a fastener 118a, and a second fastener (not shown), both of which fasteners extend through corresponding apertures (not shown) formed in the mounting plate 116 and the horizontal plate 114 and are fastened to the pick head 70a.

The horizontal plates 88 and 114 allow for a slight degree of flexion, such that the pick head 70a can move slightly vertically when the head 70a contacts a die. This prevents damage to the pick head 70a and to a die should the arm 13a be lowered too far. This compliance is also necessary during transfer of a die to the place arm 13b, so as to compensate for errors, including die thickness errors. The tension arm 122 is connected at one end to the bracket 82, so as to bias the body 102 in a normally fixed position with respect to the bracket 82. Setscrew 128 has a conical end which pushes a ball (not shown) into an aperture in the bracket 82, against tension arm 122. This provides an adjustable means for controlling the tension or compliance force of the pick head 70a. A nylon-tipped set screen 126 locks the conical set screw 128 in place so that the force adjustment does not change during operation.

The pick head 70a includes a body portion 102, a vacuum port 110, and an interchangeable vacuum nozzle 112. To remove a die from a wafer, the pick head 70a is lowered to the die, such that the vacuum nozzle 112 contacts the die. A vacuum is then drawn at the vacuum port 110, which is in fluid communication with the vacuum nozzle 112 (i.e., via a duct (not shown) formed in the body portion 102). This creates suction, which causes the die to remain in position against the vacuum head 112. The vacuum head 112 can then be moved upwardly away from the wafer. This motion, in combination with upward force exerted by a needle (not shown) positioned below the wafer and a vacuum applied to an adhesive backing of the layer from a vacuum platform (not shown), thereby removes the die from the wafer. The pick arm 13a can then be moved to contact the place arm 13b, during which time the vacuum is maintained to prevent the die from falling off of the vacuum head 112. When the die has been transferred to the place arm 13b, the vacuum is then released. The vacuum nozzle 112 is retained in position in the pick head 70a via a set screw 130, which can be selectively adjusted to permit other vacuum nozzles to be interchanged with the vacuum nozzle 112. A set screw 132 prevents loss of rotational alignment for specific nozzles which may be shaped to coincide with specific features on a die.

The pick head 70a also includes a prism assembly 104, a mirror 108, and a fiducial 106, which, together with the camera 20a and the camera 20b (see FIG. 1), allow for calibration of the pick arm 13a and the pick head 70a. The fiducial 106 includes markings which can be utilized to judge the position of the pick head 70a. For example, if an image of the fiducial location is saved at the time of machine set-up, this image may be compared to an image taken a number of die placements later. As shown in FIG. 16, the prism 104 and the mirror 108, respectively, divert and reflect an optical path 134, so that the length of the optical path 134 beginning from the fiducial 106 and extending to the mirror 108 is the same, optically, as the straight-line distance between the fiducial 106 and a die to be picked or handed off.

Figure 17:
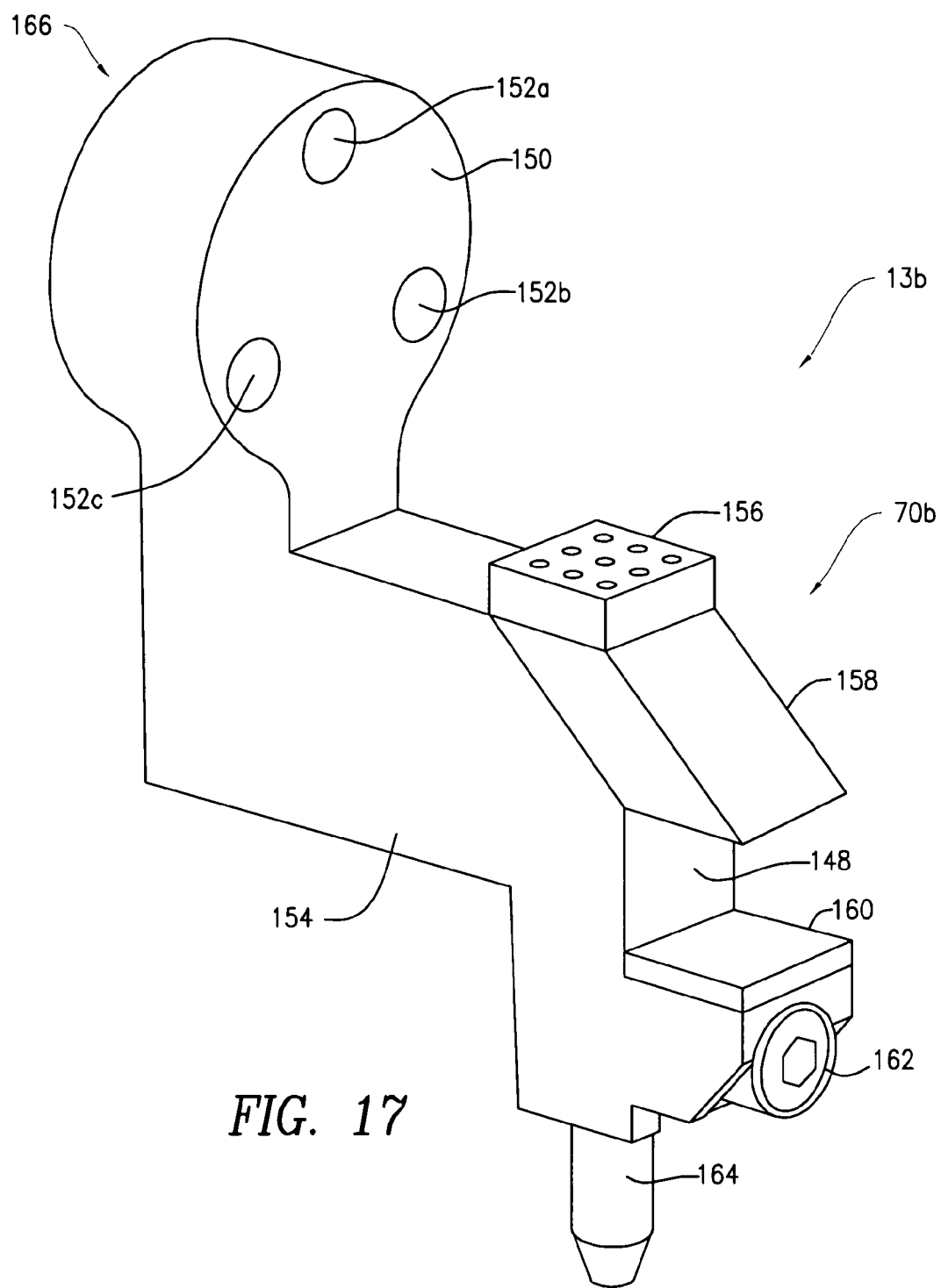
FIG. 17 is a perspective view showing a place arm employed by the place arm subassembly shown in FIGS. 11-14.
Figure 18:
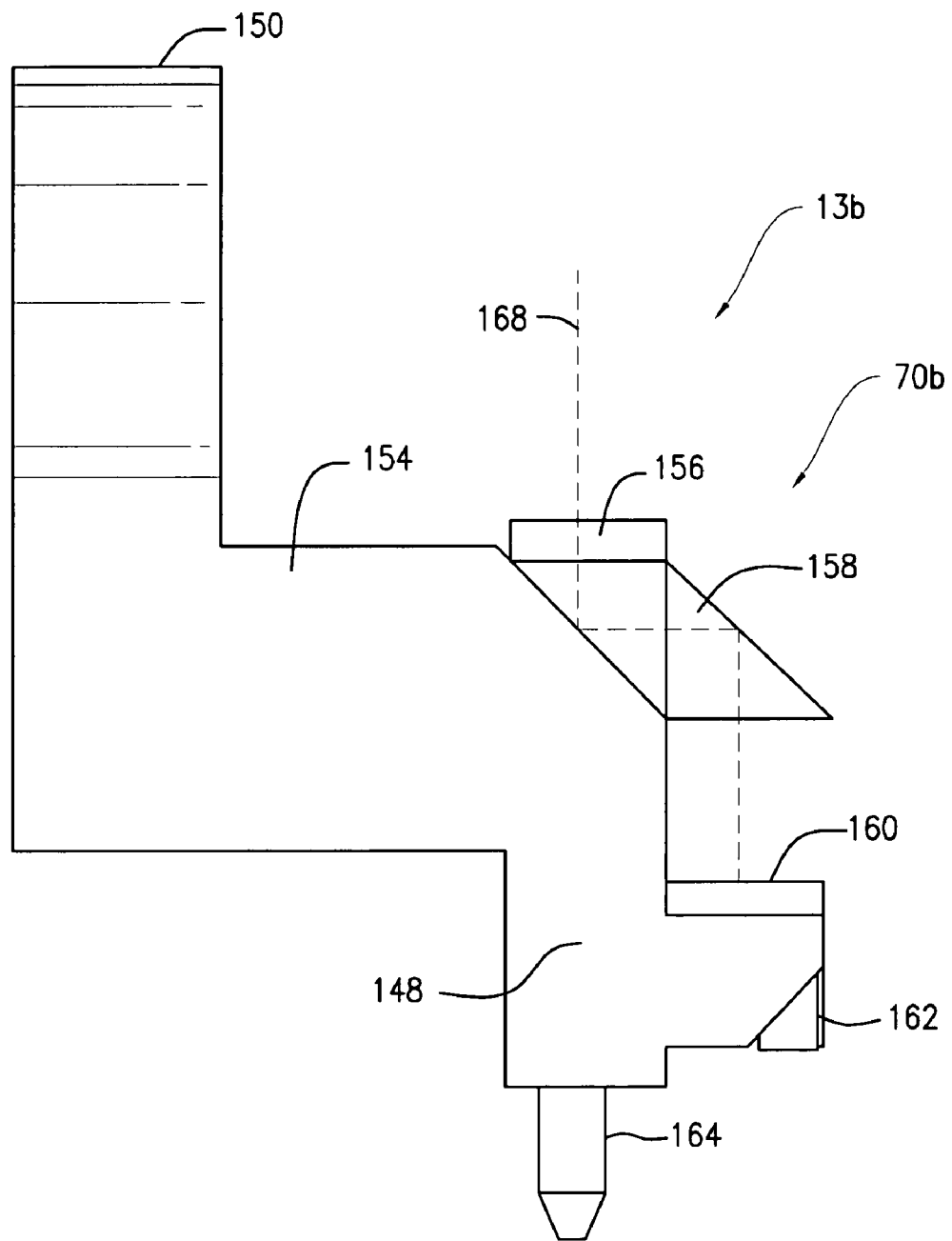
FIG. 18 is a left side elevation view of the place arm shown in FIG. 17.

Referring to FIGS. 17-18, the place arm 13b is shown in greater detail. The place arm 13b includes a bracket 150, a horizontal portion 154, and the place head 70b. The bracket 150 includes apertures 152a-152c, which receive the fasteners 69a-69c, respectively, for fastening the place arm 13b to the shaft 66b (see FIGS. 11-14). The place head 70b includes a vertical portion 148, a vacuum nozzle 164, and a set screw 162 for retaining the vacuum nozzle 164 in position in the place head 70b. The set screw 162 can be selectively disengaged to allow other vacuum nozzles to be substituted in place of the vacuum nozzle 164. A vacuum port 166 is provided on the bracket 150, and is in fluid communication with the vacuum nozzle 164 via a duct (not shown) formed in the bracket 150, the horizontal portion 154, and the vertical portion 148. When the pick arm 13a and the place arm 13b are rotated inwardly (see FIG. 6c), handoff of a die to the place arm 13b occurs by drawing a vacuum at the vacuum port 166 of the place arm 13b while simultaneously releasing the vacuum applied to the pick arm 13a. This causes the die to be released from the pick arm 13a and held in position against the conical vacuum nozzle 164 of the place arm 13b. Once the die has been transferred, the vacuum is maintained to prevent the die from falling off of the vacuum nozzle 164. During placement of the die into the pocket 17 of the pocketed tape 16 (see FIG. 6e), the vacuum applied to vacuum port 166 is released, and a slight amount of positive air pressure is applied to the vacuum port 166 to ensure release of the die from the vacuum nozzle 164.

The place head 70b also includes a prism assembly 158, a mirror 160, and a fiducial 156, which, together with the camera 20c (see FIG. 1), allow for calibration of the place arm 13b and the place head 70b. The fiducial 156 includes markings which can be utilized to judge the position of the place head 70b. For example, if an image of the fiducial location is saved at the time of machine set-up, this image may be compared to an image taken a number of die placements later. Such a comparison allows for changes in position to be compensated for. As shown in FIG. 18, the prism 158 and the mirror 160, respectively, divert and reflect an optical path 168, so that the length of the optical path 168 beginning from the fiducial 156 and extending to the mirror 160 is the same, optically, as the straight-line distance between the fiducial 156 and a die to be placed.

Figure 19:
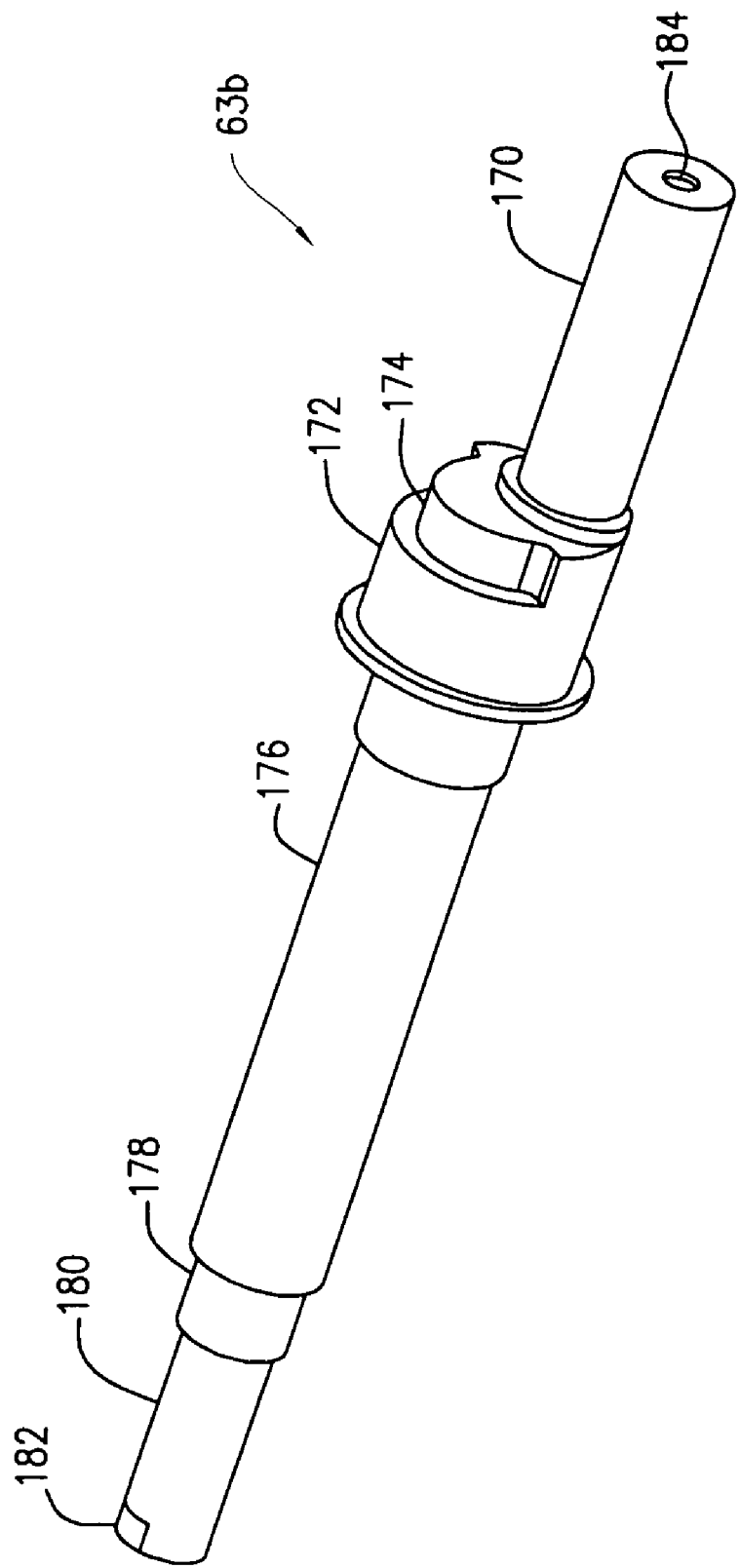
FIG. 19 is a perspective view showing an eccentric drive employed by the power drive assembly of FIGS. 2-5.
Figure 20:
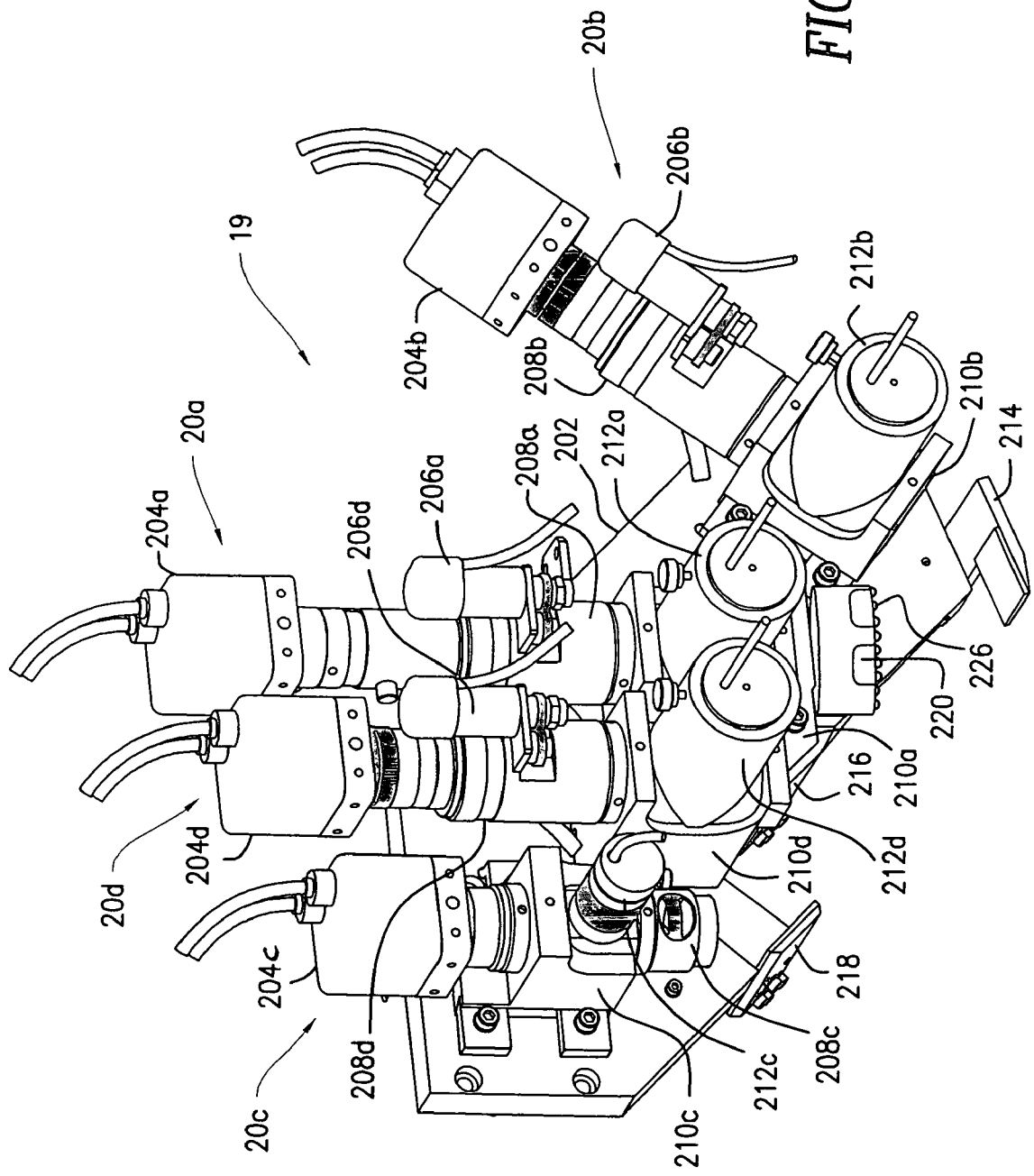
FIG. 20 is a perspective view showing an optical inspection system employed by the robotic die sorter of FIG. 1.
Figure 21:
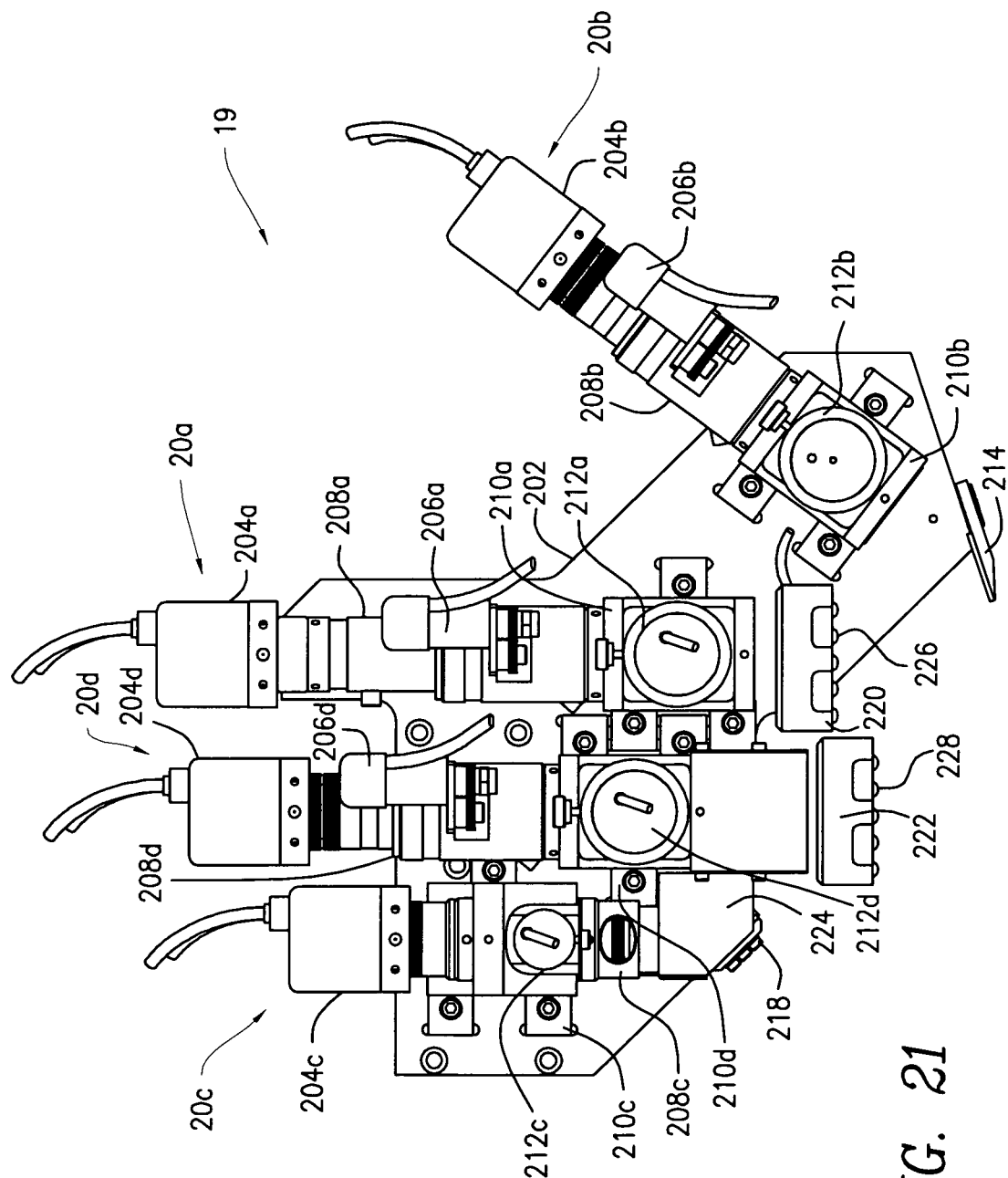
FIG. 21 is a front elevation view of the optical inspection system shown in FIG. 20.
Figure 22:
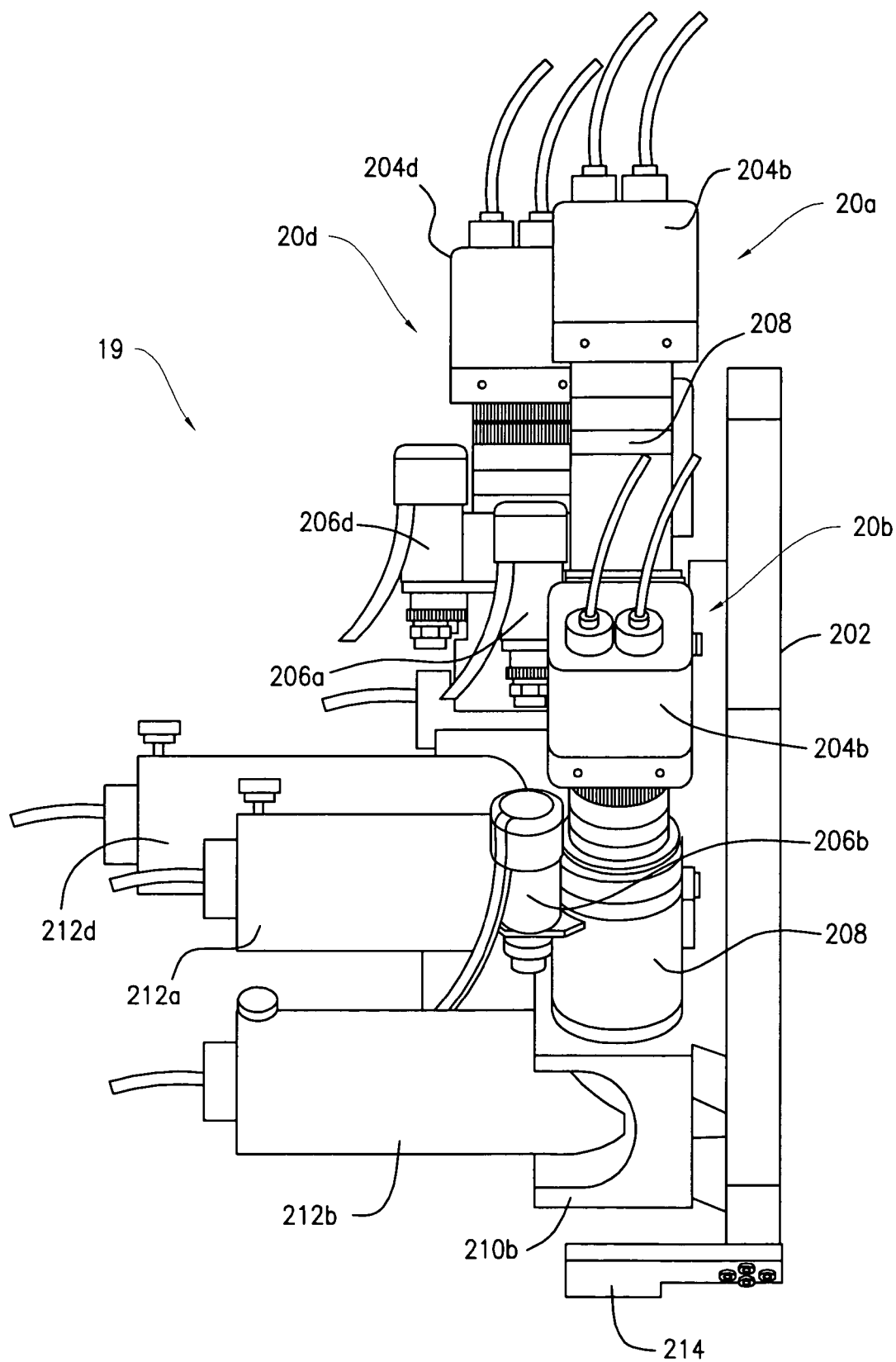
FIG. 22 is a left side elevation view of the optical inspection system shown in FIG. 21.
Figure 23:
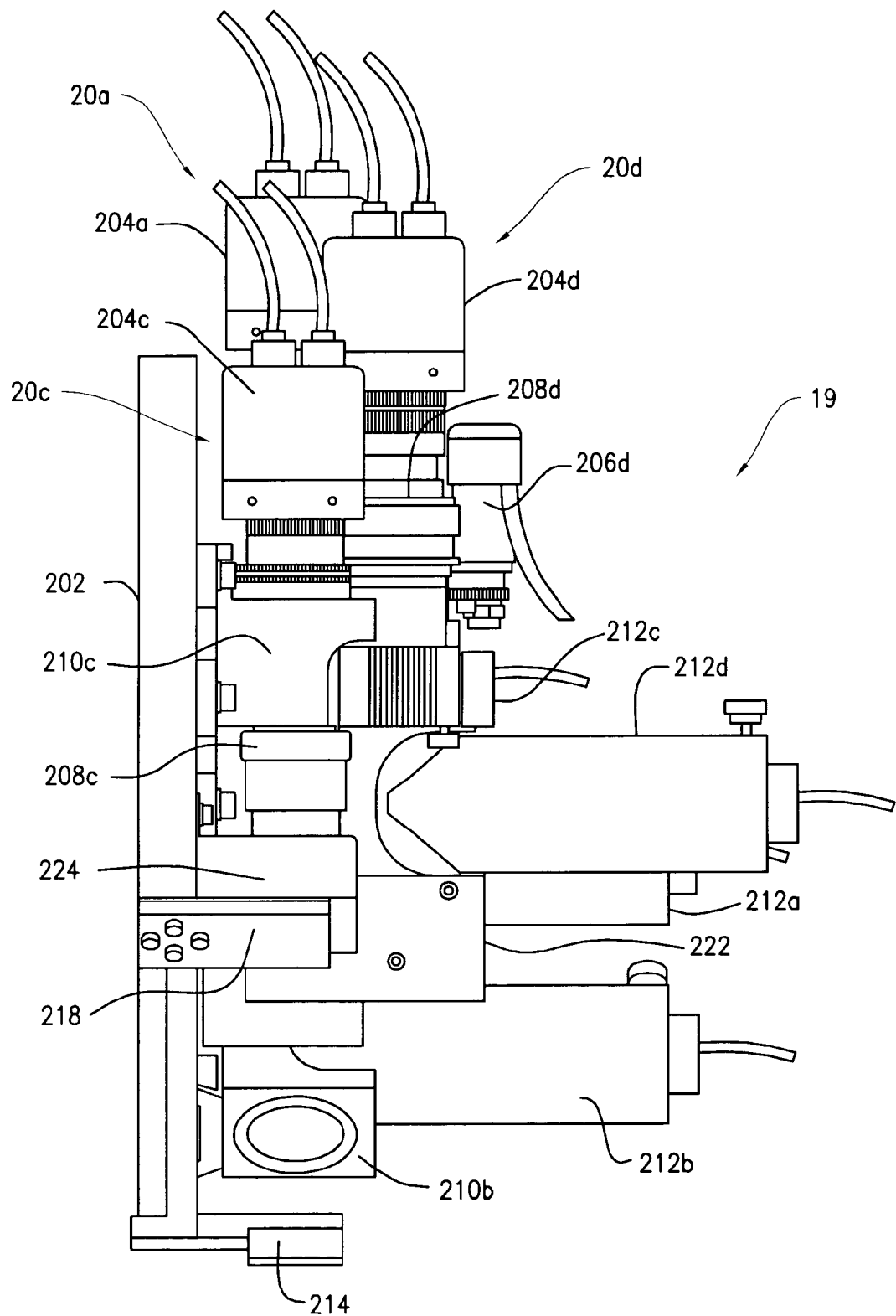
FIG. 23 is a right side elevation view of the optical inspection system shown in FIG. 21.

FIG. 19 shows the eccentric drive 63b of the place arm subassembly 12b in greater detail. The eccentric drive 63b includes an arm 170 to which the linkage 50b is attached (see FIG. 12), motor bearing surfaces 172 and 178 which contact bearings (not shown) of the Y-axis drive motor 34b (see FIG. 13), a recessed portion 174 which cooperates with the sensor 74b to determine the correct initial direction for start up and homing, a rotor mounting portion 176 to which a motor rotor (not shown) of the Y-axis drive motor 34b (see FIG. 13) is mounted, and an extension 182 having an encoder mounting diameter 180. The extension 182 and the encoder mounting diameter 180 are inserted into and cooperate with a commercially-available incremental optical rotary encoder (discussed above) for monitoring the position the eccentric drive 60b and the Y-axis drive motor 34b (see FIG. 13). The arm 170 includes a central aperture 184 for receiving the fastener 56b (see FIG. 11). The longitudinal axis of the arm 170 is offset from the longitudinal axis of the rotor mounting portion 176 by 5 mm. The construction of the eccentric drive 63a of the pick arm assembly 12a is identical to the construction of the eccentric drive 63b. The eccentric drives 60a and 60b are nearly identical in construction to the eccentric drive 63b, except that the arm 170 is offset from the longitudinal axis of the rotor mounting portion 176 by 2.5 mm and the recess portion 174 is not included.

Referring now to FIGS. 20-23, the optical inspection system 19 of the present invention is shown in greater detail. The optical inspection system 19 includes the pick alignment/inspection camera 20a, the handoff alignment/inspection camera 20b, the pocket alignment/inspection camera 20c, and the place alignment/inspection inspection camera 20d, each of which is mounted to a mounting plate 202 via mounting assemblies 210a, 210b, 210c, and 210d, respectively. The cameras 20a-20d include digital camera modules 204a-204d, respectively. The digital cameras 20a-20d could include 652× 494 pixel resolution progressive scan digital cameras manufactured by Opteon Corp. Any suitable analog or digital camera could be substituted for each of the digital camera modules 204a-204d without departing from the spirit or scope of the present invention. The camera format must provide sufficient resolution and acquisition speed to meet predefined throughput requirements.

The cameras 20a-20d also include optical assemblies 208a-208d, respectively. The optical assemblies 208a-208d include customized, wide-angle vision illuminators manufactured by Qioptic, Ltd., which include lenses and shortened illumination ports, in addition to camera attachment tubes for attaching the digital camera modules 204a-204d, respectively. Zoom motors 206a, 206b, and 206d allow for remote focusing of the optical assemblies 208a, 208b, and 208d, respectively. The pocket alignment camera 20c includes mirrors 216 and 218 (see FIG. 20) for deflecting the optical axis of the camera 20c so as to allow alignment of a tape pocket or of the place arm 13a (see FIG. 1). The mirrors 216 and 218 are mounted to the mounting plate 202, and could be positioned in a mirror housing 224 (see FIG. 20). The cameras 20a-20 d include on-axis lighting assemblies 212a-212d, respectively. Each of the on-axis lighting assemblies 212a-212d includes an array of light emitting diodes (LEDs) positioned at one end of the assembly, and a 50/50 mirror positioned at an opposite end of the assembly and in the optical path of a corresponding one of the optical assemblies 208a-208d. One half of the light provided by each LED array is reflected toward the object to be inspected (i.e., the pick arm 13a, the place arm 13a, a die during post-pick inspection, or a die after placement into a pocketed tape), whereupon the light is reflected back by the object and toward one of the camera modules 204a-204d. Such an arrangement emphasizes objects which are perpendicular to the optical axes of each camera module 204a-204d, while minimizing objects that are at angles to the optical axes, so as to enhance details of the surfaces of the objects under inspection.

The optical axis of the handoff alignment/inspection camera 20b is deflected by a mirror 214 (see FIG. 20) to allow for inspection of a die after it has been transferred from the pick arm 13a to the place arm 13b. The optical axis of the pocket alignment/inspection camera 20c is deflected by two mirrors 218 and 216 (see FIG. 20). The mirrors 218 and 216 are mounted to the optics mounting plate 202. The mirrors 218 and 216 allow for alignment of a tape pocket into which a die is to be placed.

In addition to on-axis lighting, the pick alignment/inspection camera 20a includes an off-axis lighting assembly 226 positioned in a housing 220. The off-axis lighting assembly 226 includes an annular ring of LEDs arranged so that the optical axis of the camera module 204a passes through the center of the lighting assembly 226. The place alignment/inspection camera 20 d includes a similar off-axis lighting assembly 228 positioned in a housing 222 (see FIG. 21), such that the optical axis of camera module 204d passes through the center of the lighting assembly 228. A similar off-axis lighting assembly (not shown) is provided for the pocket alignment/inspection camera 20c, such that the optical axis of the camera module 204c (after being deflected by the mirrors 218 and 216) passes through the center of the lighting assembly.

Figure 24:
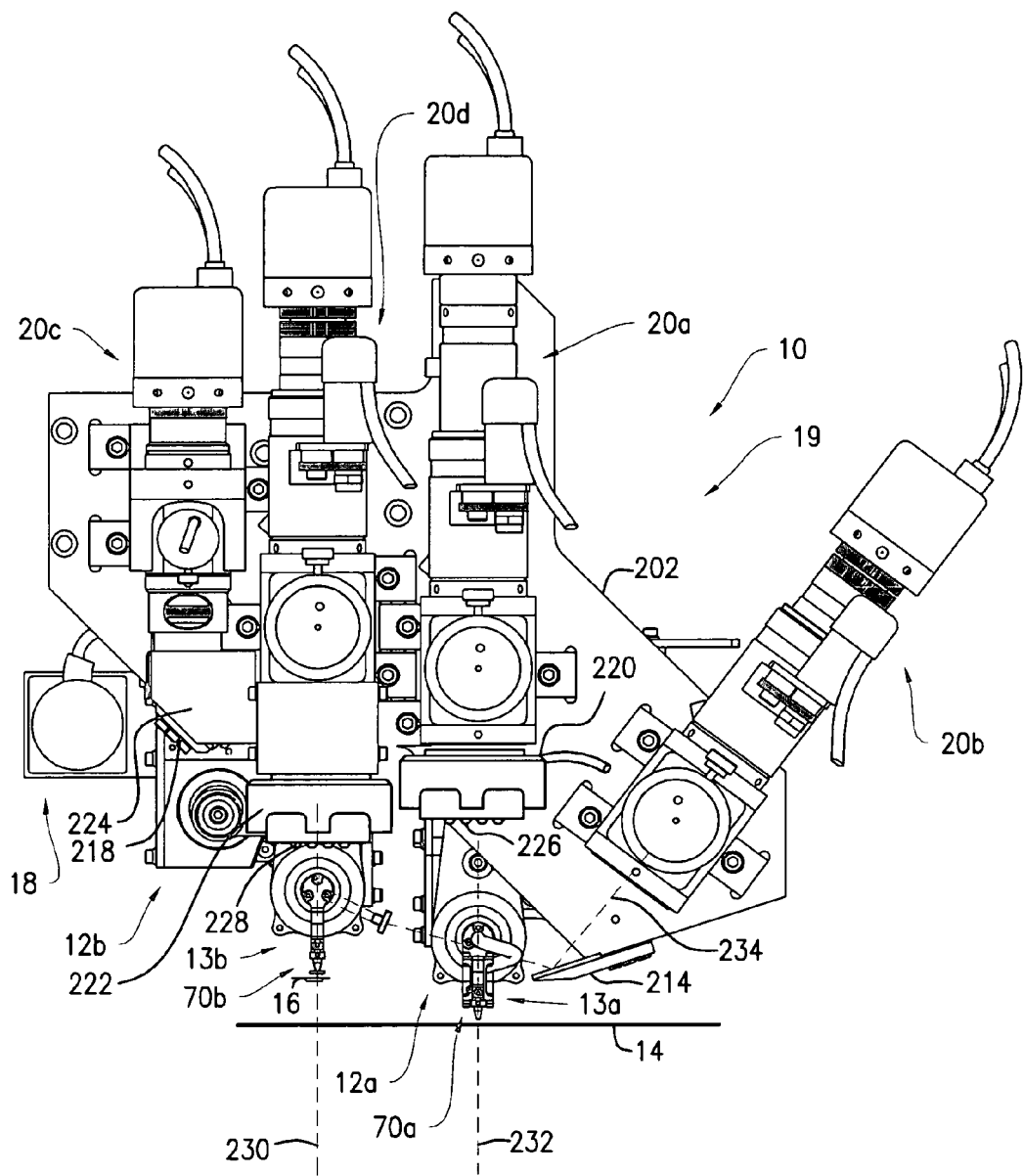
FIG. 24 is a front elevation view showing the optical inspection system of FIGS. 20-23 in operation with the power drive assembly of FIGS. 2-5.
Figure 25:
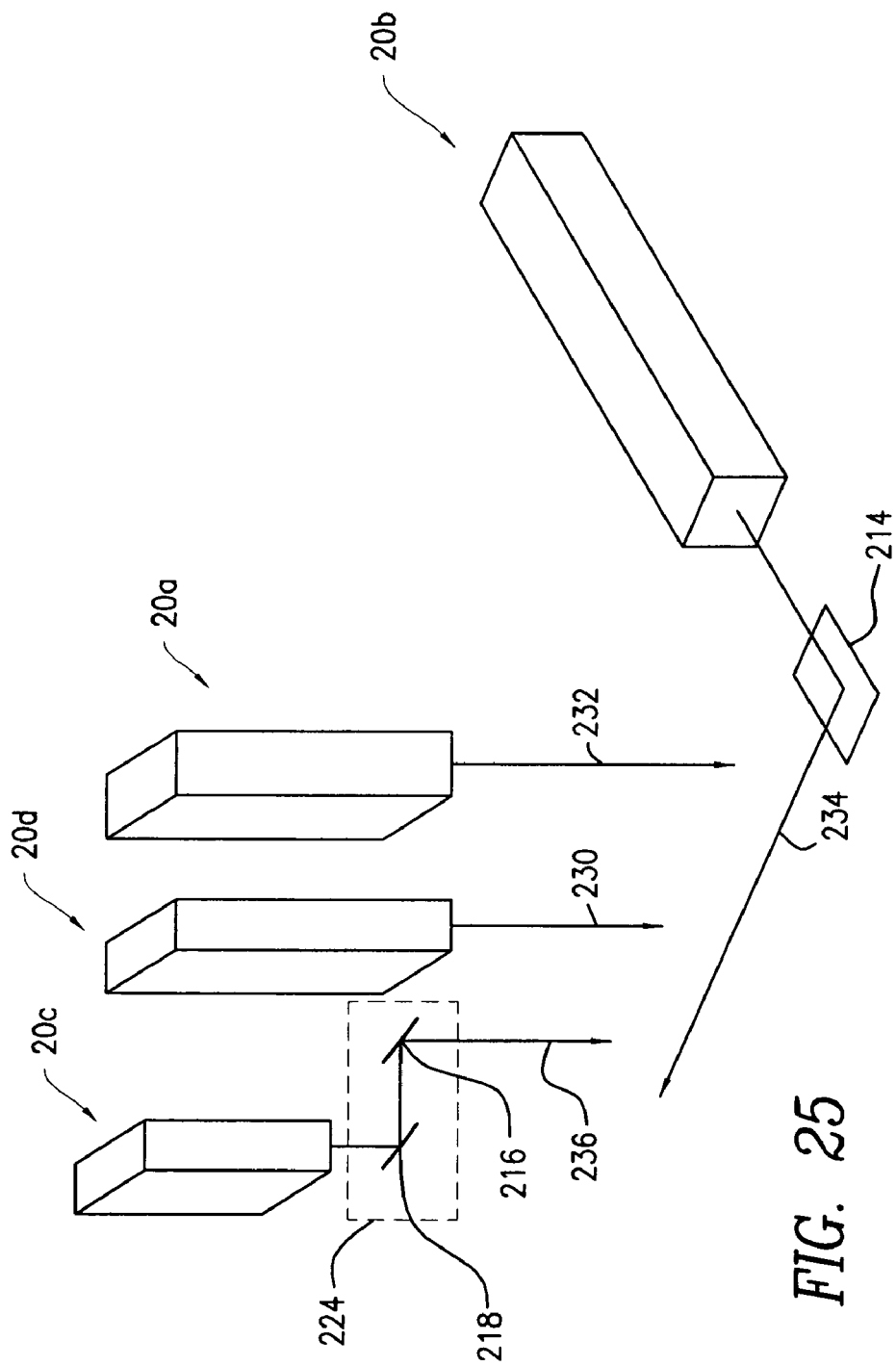
FIG. 25 is a schematic diagram illustrating optical paths of the optical inspection system shown in FIGS. 20-23.

Referring to FIG. 24, the optical inspection system 19 is shown in position with respect to the X-axis drive assembly 18, the pick arm subassembly 12a, and the place arm subassembly 12b. As shown in FIGS. 24 and 25, the pick alignment/inspection camera 20a is aligned to allow inspection/alignment of a die to be picked or the pick head 70a, as shown by optical path 232. As mentioned above, such inspection allows for precise calibration of the position of the pick arm 13a. After a die has been transferred from the pick head 70a of the pick arm 13a to the place head 70b of the place arm 13b, it is in optical alignment with the optical path 234 of the handoff alignment/inspection camera 20b, to allow for inspection to ensure that the die has been properly transferred. This inspection may be done as soon as the pick arm 13a is out of the way. The pocket alignment/inspection camera 20c is aligned (via mirrors 218 and 216 in mirror housing 224) to allow for inspection of a tape pocket or the place arm 70b, as shown by optical path 236 (see FIG. 25). The place alignment/inspection camera 20 d is aligned to allow inspection of the die after it has been placed into the pocketed tape 16, as shown by optical path 230. It should be noted that the cameras 20a-20d of the optical inspection system 19 could be integrated with a suitable, commercially-available machine vision system so as to allow for automated monitoring, calibration, and control of the die sorter 10. Further, a fifth inspection camera (not shown) could be provided for inspecting dies after placement into pocketed tape and subsequent sealing of each pocket using a commercially-available sealing tape. This also allows for measurement of the position of the cover tape relative to the pocketed tape, which is a common customer requirement.

It will be understood that the embodiments described herein are merely exemplary and that a person skilled in the art may make many variations and/or modifications without departing from the spirit and scope of the present invention. All such variations and modifications are intended to be included within the scope of the present invention.

What is claimed is:

1. A robotic die sorter, comprising a picking mechanism moveable between a picking location and a transfer location, said picking mechanism including first and second drive means for driving said picking mechanism, said first and second drive means coupled together by a first linkage and a first arm, said first and second drive means operating together to move said picking mechanism in horizontal and vertical directions; a placing mechanism moveable between said transfer location and a placement location, said placing mechanism including third and fourth drive means for driving said placing mechanism, said third and fourth drive means coupled together by a second linkage and a second arm, said third and fourth drive means operating together to move said placing mechanism in horizontal and vertical directions; first vacuum means for creating a suction sufficient to maintain a die on said picking mechanism as said picking mechanism moves from said picking location to said transfer location; and second vacuum means for creating a suction sufficient to transfer the die from said picking mechanism to said placing mechanism when said picking and placing mechanisms are positioned at said transfer location and to maintain the die on said placing mechanism as said placing mechanism moves from said transfer location to said placement location.

2. The robotic die sorter of claim 1, wherein said picking mechanism further includes a first eccentric drive mounted between said first drive means and said first linkage and a second eccentric drive mounted between said second drive means and said first arm.

3. The robotic die sorter of claim 2, wherein said picking mechanism further includes fifth drive means for rotating said picking mechanism.

4. The robotic die sorter of claim 1, wherein said placing mechanism further includes a first eccentric drive mounted between said third drive means and said second linkage and a second eccentric drive mounted between said fourth drive means and said second arm.

5. The robotic die sorter of claim 4, wherein said placing mechanism further includes fifth drive means for rotating said placing mechanism.

6. The robotic die sorter of claim 1, further including a camera operatively associated with said picking and placing mechanisms, said camera being operable to inspect said placing mechanism for proper alignment when said placing mechanism is positioned at said transfer location.

7. The robotic die sorter of claim 6, wherein said camera is operable to inspect said die at said transfer location after said die has been transferred from said picking mechanism to said placing mechanism.

8. A robotic die sorter, comprising a picking mechanism moveable between a picking location and a transfer location, said picking mechanism including first and second drive means for driving said picking mechanism, said first and second drive means coupled together by a first linkage and a first arm, said first and second drive means operating together to move said picking mechanism in horizontal and vertical directions; a placing mechanism moveable between said transfer location and a placement location, said placing mechanism including third and fourth drive means for driving said placing mechanism, said third and fourth drive means coupled together by a second linkage and a second arm, said third and fourth drive means operating together to move said placing mechanism in horizontal and vertical directions; first vacuum means for creating a suction sufficient to maintain a die on said picking mechanism as said picking mechanism moves from said picking location to said transfer location; second vacuum means for creating a suction sufficient to transfer the die from said picking mechanism to said placing mechanism when said picking and placing mechanisms are positioned at said transfer location and to maintain the die on said placing mechanism as said placing mechanism moves from said transfer location to said placement location; and a camera operatively associated with said picking mechanism and said placing mechanism, said camera operable to inspect said placing mechanism for proper alignment when said placing mechanism is positioned at said transfer location, and said camera operable to inspect the die at said transfer location after the die has been transferred from said picking mechanism to said placing mechanism.

9. The robotic die sorter of claim 8, wherein said picking mechanism further includes fifth drive means for rotating said picking mechanism.

10. The robotic die sorter of claim 8, wherein said placing mechanism further includes fifth drive means for rotating said placing mechanism.

11. The robotic die sorter of claim 8, wherein said picking mechanism further includes a first eccentric drive mounted between said first drive means and said first linkage and a second eccentric drive mounted between said second drive means and said first arm.

12. The robotic die sorter of claim 8, wherein said placing mechanism further includes a first eccentric drive mounted between said third drive means and said second linkage and a second eccentric drive mounted between said fourth drive means and said second arm.

13. The robotic die sorter of claim 8, further including a second camera operable to inspect the die prior to removal of the die from a wafer and to inspect the picking mechanism for proper alignment.

14. The robotic die sorter of claim 13, further including a third camera operable to inspect the die after placement of the die into a pocketed tape by the placing mechanism and to inspect the placing mechanism for proper alignment.

15. The robotic die sorter of claim 14, further including a fourth camera operable to inspect the pocketed tape for proper alignment.

* * * * *